United States Patent
Lin et al.

(10) Patent No.: US 8,110,345 B2
(45) Date of Patent: Feb. 7, 2012

(54) HIGH RESOLUTION LITHOGRAPHY SYSTEM AND METHOD

(75) Inventors: Chin-Hsiang Lin, Hsin-Chu (TW); Burn Jeng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1404 days.

(21) Appl. No.: 11/043,304

(22) Filed: Jan. 26, 2005

(65) Prior Publication Data

US 2005/0147921 A1 Jul. 7, 2005

Related U.S. Application Data

(63) Continuation-in-part of application No. 10/309,427, filed on Dec. 4, 2002, now Pat. No. 7,005,235.

(51) Int. Cl.
*G03F 7/20* (2006.01)
*G03F 7/26* (2006.01)

(52) U.S. Cl. .................... 430/394; 430/322

(58) Field of Classification Search ............ 430/311, 430/394, 322
See application file for complete search history.

(56) References Cited

U.S. PATENT DOCUMENTS

| | | | | |
|---|---|---|---|---|
| 4,517,280 A | * | 5/1985 | Okamoto et al. | 430/321 |
| 4,568,631 A | * | 2/1986 | Badami et al. | 430/315 |
| 5,216,257 A | * | 6/1993 | Brueck et al. | 250/548 |
| 5,225,918 A | * | 7/1993 | Taniguchi et al. | 359/12 |
| 5,415,835 A | * | 5/1995 | Brueck et al. | 430/311 |
| 6,818,389 B2 | * | 11/2004 | Fritze et al. | 430/5 |
| 2004/0102945 A1 | * | 5/2004 | Liu | 703/14 |
| 2004/0110092 A1 | * | 6/2004 | Lin | 430/311 |

FOREIGN PATENT DOCUMENTS

| | | |
|---|---|---|
| JP | 59-66117 A | 4/1984 |
| JP | 2067559 A | 3/1990 |
| JP | 9153446 A | 6/1997 |
| JP | 2000260705 A | 9/2000 |
| JP | 2002175981 A | 6/2002 |

OTHER PUBLICATIONS

Japanese Patent Office, Japanese Office Action of Jan. 20, 1999, Patent Application No. 2006-016904, 6 pages.
Japanese Patent Office, Japanese Office Action dated May 12, 2009, Patent Application No. 2006-016904, 4 pages.

* cited by examiner

*Primary Examiner* — Kathleen Duda
*Assistant Examiner* — Brittany Raymond
(74) *Attorney, Agent, or Firm* — Haynes and Boone, LLP

(57) ABSTRACT

Provided are a high resolution lithography system and method. In one example, a method for producing a pattern on a substrate includes separating the pattern into at least a first sub-pattern containing lines oriented in a first direction and a second sub-pattern containing lines oriented in a second direction. Lines oriented in the first direction are created on a first layer of photosensitive material on the substrate using a first standing wave interference pattern. A portion of the created lines are trimmed to create the first sub-pattern. A second layer of photosensitive material is applied to the substrate after creating the first sub-pattern. Lines oriented in the second direction are created on the second layer using a second standing wave interference pattern. A portion of the created lines are trimmed to create the second sub-pattern.

8 Claims, 28 Drawing Sheets

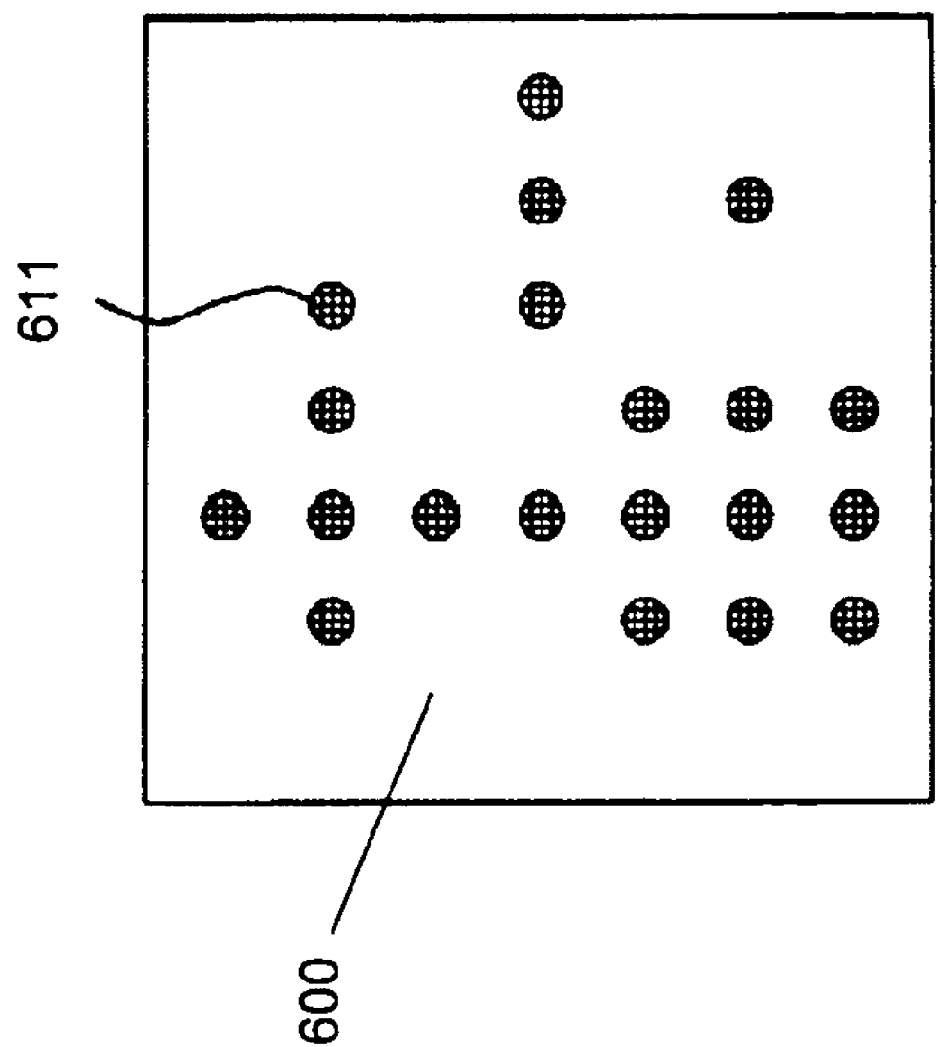

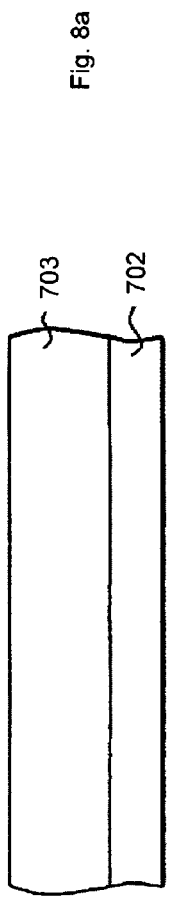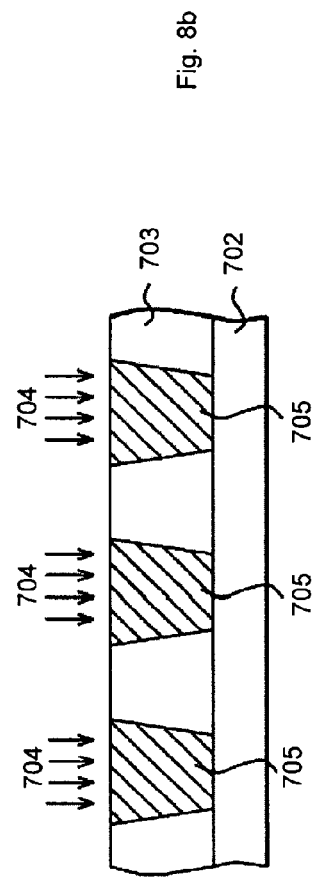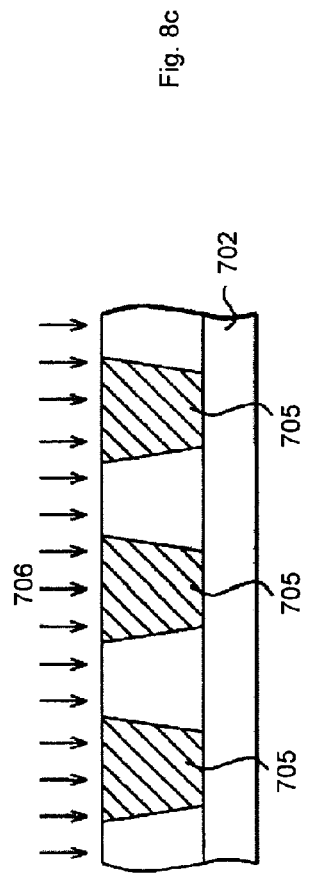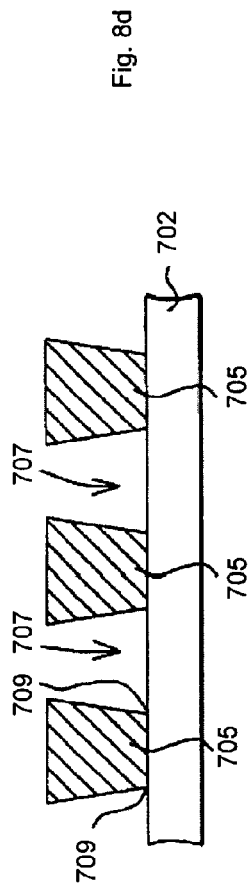

HIGH RESOLUTION LITHOGRAPHY SYSTEM AND METHOD

CROSS REFERENCE TO RELATED APPLICATIONS

The present application is a continuation-in-part of copending U.S. patent application Ser. No. 10/309,427, filed on Dec. 4, 2002, which is herein incorporated by reference in its entirety.

FIELD OF TECHNOLOGY

The present disclosure relates generally to the field of semiconductor manufacturing and, more particularly, to a system and method of interferometric photolithography for producing patterns in a photosensitive material.

BACKGROUND

The fabrication of microelectronic integrated circuitry generally involves the patterning of device structures and layouts on a semiconductor substrate. The accepted practice for creating the requisite pattern is to first form a replica of the pattern on a mask (not necessarily in its final size) and then to transfer the mask pattern to a layer of photoresistive material, either positive or negative photoresist, formed on the semiconductor substrate. The transfer is accomplished by an optical photolithographic process, shining light of a certain wavelength through the mask and onto the photoresist, using whatever optical lenses are required to replicate the pattern in its proper size on the photoresist. Once the pattern has been transferred to the photoresist, the photoresist is processed to selectively remove portions of the pattern and expose the substrate below. The substrate itself can then be etched by, for example, an anisotropic plasma etch, wet etch, or otherwise processed as required.

With the progressive shrinking of device sizes to as small as tenths of a micron or below, the dimensions of patterns to be transferred by optical photolithography are approaching the sub-wavelengths of the optical radiation. As this occurs, maintaining both a high pattern resolution and a depth of focus to allow good patterning on a substrate of imperfect planarity may become a problem.

Accordingly, what is needed is a system and method of using interferometric photolithography that is simple and/or applicable to a wider range of patterns.

BRIEF DESCRIPTION OF THE DRAWINGS

FIG. 7 is a schematic diagram of the developed photoresistive medium (assumed negative), subsequent to the masking of FIG. 6 and additional conventional photoexposure, showing the creation of the remaining holes which constitute the desired pattern to be reproduced in the substrate.

FIGS. 8a, 8b, 8c, and 8d are a representation of the steps in FIGS. 6 and 7 above for a positive photoresist.

DETAILED DESCRIPTION

Figure 1:
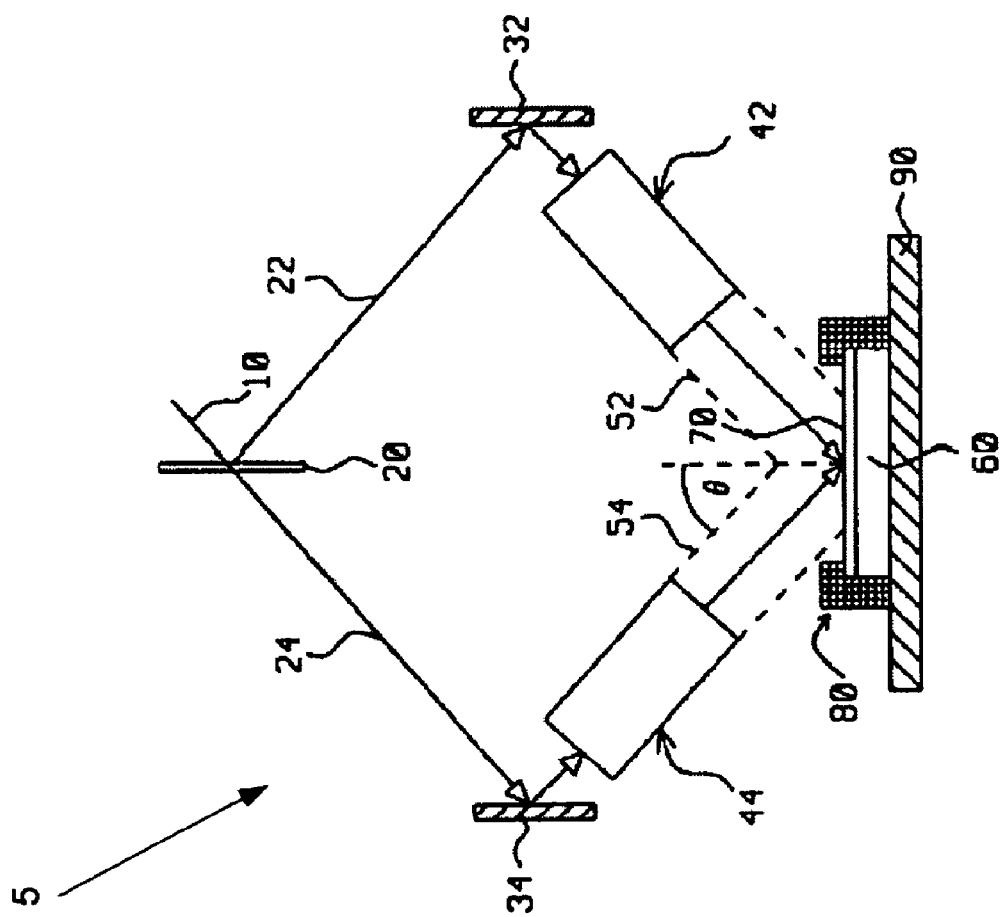
FIG. 1 is a schematic diagram of a first embodiment of a type of apparatus suitable for producing an interference pattern (a pattern of interference fringes) on a photoresistive material.

The present disclosure relates generally to the field of semiconductor manufacturing and, more particularly, to a system and method of interferometric photolithography for producing patterns in a photosensitive material. It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

One method of solving the problems introduced by the need for both a high pattern resolution and a good depth of focus to allow precise patterning on a substrate of imperfect planarity uses sophisticated mask designs, such as phase shifting masks. Another way of avoiding this problem, at least when the pattern to be transferred has a certain appropriate shape or periodicity, is by the use of interferometric photolithography rather than optical lithography. In interferometric lithography the pattern is directly formed by the standing wave interference pattern of two or more coherent optical beams rather than by the use of transmissive or reflective optical systems to transfer images of patterns in masks to a wafer surface. In short, the interference pattern becomes the transferred pattern. Three advantages of this approach are: 1) the dimensions of patterns that can be produced by wave interference is on the order of fractions of a wavelength; 2) a better depth of focus than conventional optical lithography; and 3) a lower tool cost than a conventional optical stepper or scanner.

In one embodiment, there is provided a method of forming an interferometric pattern of sub-micron holes by means of a triple exposure of a photosensitive material using a beam splitting apparatus. In one embodiment, the photosensitive material is a photoresistive material, or photoresist. In this embodiment, the first exposure is produced by a standing wave interference pattern between coherent laser beams produced by splitting and recombining a single laser beam (the x-direction pattern); the second exposure is produced by the same standing wave pattern, but with the photosensitive material now rotated through 90° about a vertical axis relative to the first exposure (the y-direction pattern) so that the second exposure is superimposed upon the first to form a regular array; the third exposure is produced by a uniform light source passing through a non-critical mask (which may include a non-critical stepper or scanner) formed to delineate those regions of the photoresistive material which are to retain the pattern and to permit elimination of the pattern from regions where it is not desired. Finally, the photoresistive material is developed by methods consistent with the type of photoresistive material being used and the final pattern of holes is obtained. It is to be noted that the method of this first embodiment is not limited in scope to patterns produced by only a triple exposure. A multiplicity of interferometric patterns may be produced at different relative angles of the substrate to produce a more complex final pattern.

Referring first to FIG. 1, there is shown a schematic diagram of an apparatus 5 that can be used to form a standing wave interference pattern between two coherent light beams. A single incident beam of light 10, such as that produced by a laser or other source of monochromatic light having a high degree of spatial and temporal coherence, is incident on a beam splitter 20. The reflected beam 22 and transmitted beam 24 are directed at reflecting surfaces 32 and 34, respectively, which may be planar mirrors, from which they are reflected and caused to pass through optical beam expanders 42 and 44, respectively, producing final beams 52 and 54 of sufficient uniformity and cross-section to create the desired interference pattern. The final beams 52 and 54 thereupon strike a substrate 60 covered with a photoresistive material 70, each beam making an angle θ with the normal to the substrate. The substrate is held in place within an alignment module 80 which is mounted upon a rotatable stage 90. The angle θ is critical to the pitch of fringes and to the width of the fringes within the interference pattern and can be adjusted by means of the reflecting surfaces 32 and 34.

Figure 2:
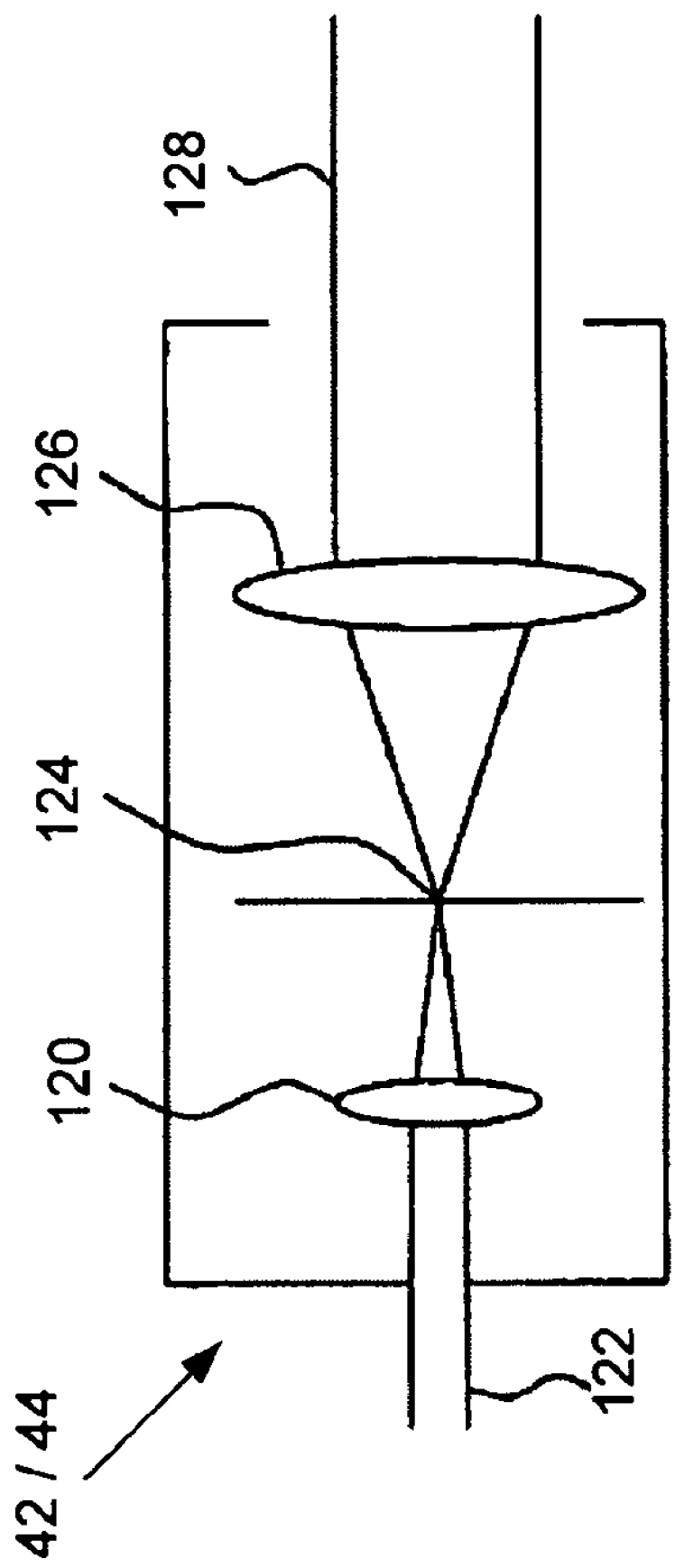
FIG. 2 is a schematic diagram of an optical beam expander used in the apparatus of FIG. 1.

Referring next to FIG. 2, there is shown an internal view of beam expanders 42 and 44 of FIG. 1, indicating their optical components. A first converging lens 120 focuses the entering laser beam 122 onto a pinhole 124 which is located at the focal point of a second converging lens 126. Since the pinhole is essentially a point source of light for the second lens 126, that lens produces an emergent beam of parallel light 128. The diameter of the emerging beam is significantly greater than that of the incident beam because of the size of the second lens.

Figure 3:
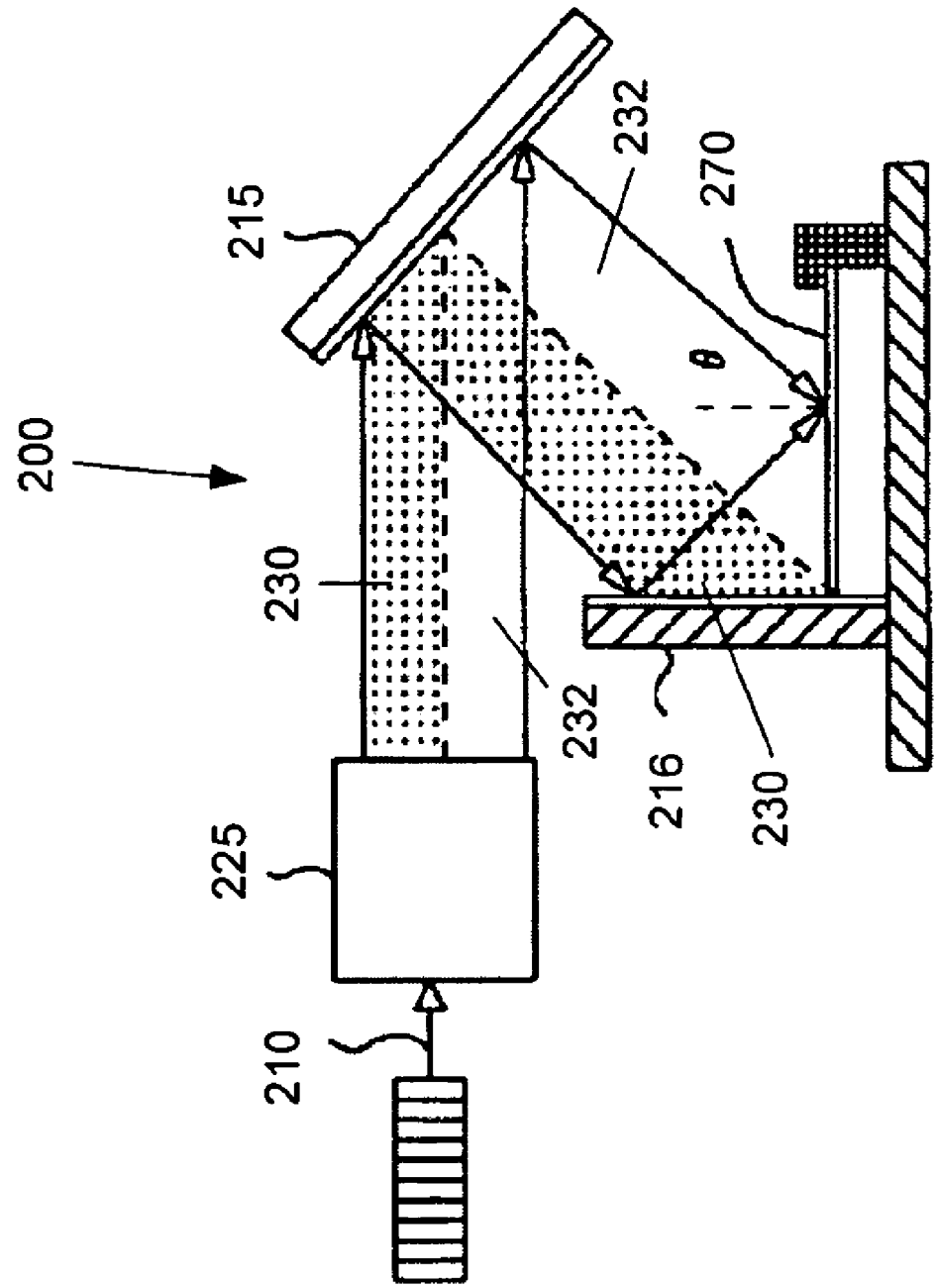
FIG. 3 is a schematic diagram of a second embodiment of a type of apparatus suitable for producing an interferometric pattern on a photoresistive material.

Referring next to FIG. 3, in another embodiment, there is shown an apparatus 200 for producing the same interferometric effect as that in FIG. 1, except that the entering beam 210 is not split and only a single beam expander 225 is used, for example a beam expander as illustrated in FIG. 2. This apparatus has a smaller footprint and may be used in environments where the size of the apparatus is a constraining factor. The reflecting surfaces 215 and 216 are not symmetrically arranged as in the apparatus of FIG. 1, and the entire apparatus may be suitable for different manufacturing arrangements than that in FIG. 1. In one embodiment, reflecting surface 216 is fixed, and reflecting surface 215 can be rotated. As is seen in FIG. 3, a shaded upper portion 230 of the expanded beam incident on reflecting surface 215 reflects from that reflecting surface onto reflecting surface 216. This shaded portion 230 of the beam thereupon interferes with the unshaded portion 232 in the region where both combine on the substrate's photosensitive layer 270.

Figure 4:
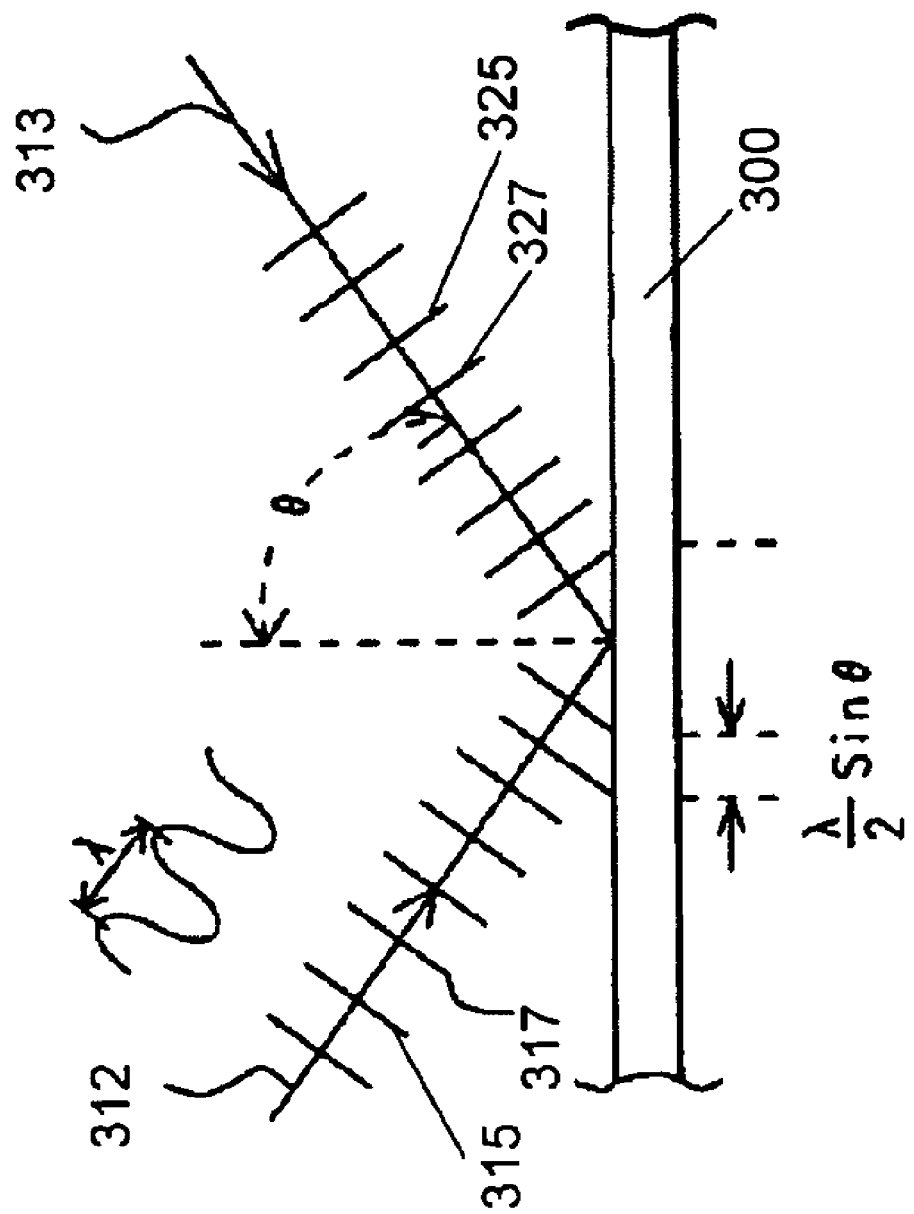
FIG. 4 is a schematic diagram showing symbolic wavefronts of the interfering beams and indicating how the angle of their incidence determines the pitch of the interference fringes.
Figure 5B:
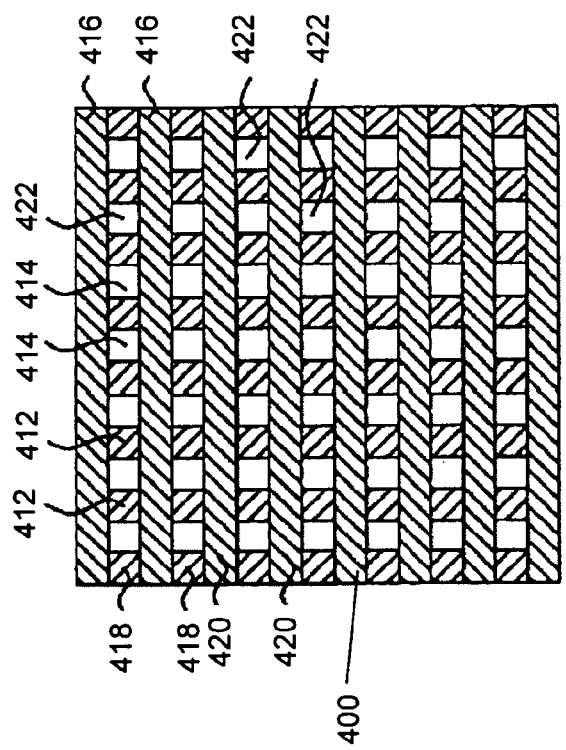
FIGS. 5a and 5b are schematic diagrams showing (a) an x-direction interference pattern and (b) the superposition of an x-direction and y-direction pattern.
Figure 5A:
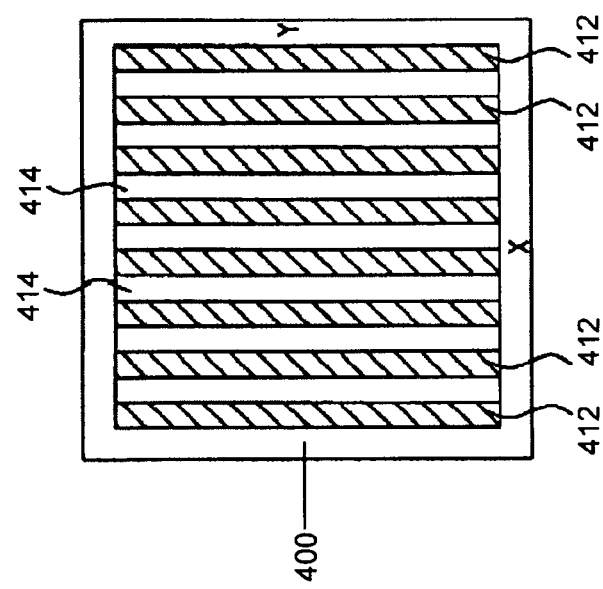

Referring next to FIGS. 4, 5a, and 5b, there is shown a schematic representation of the forming of interference fringes (interference maxima) as a result of the superposition of two coherent laser beams 312 and 313 impinging upon a planar surface 300 at an angle θ to the normal of that surface. The parallel lines indicate wavefront intensity maxima 315 and minima 317 of the beam 312, and wavefront intensity maxima 325 and minima 327 of the beam 313, which can be assumed to be plane waves. The distance between successive maxima or minima is the wavelength, λ, of the wave. When a maxima 315 of one wave overlaps a maxima 325 of the other wave on the surface, or when a minima 317 of one wave overlaps a minima 327 of the other wave on the surface, the intensity of the superposition is maximized (constructive interference) and a fringe is formed. When a maxima 315/325 overlaps a minima 327/317, the intensity approaches zero and destructive interference occurs.

In FIG. 5a, the fringes are formed in photoresist 400 and indicated as shaded areas 412, while the regions of destructive interference are indicated as unshaded areas 414. As can be deduced from the geometry, the center-to-center distance between two successive fringes is the "grating pitch" Λ, which is given by: $\Lambda = \lambda/(2 \sin \theta)$. The width of a fringe or of the space between fringes is $\Lambda/2$.

Also in FIG. 5a, there is shown a schematic diagram of an interference pattern such as would be formed on the photoresist-covered substrate shown in FIGS. 1 or 3 in accord with a method of one or more of the embodiments. The illustrated pattern in FIG. 5a would correspond to a first photoresist exposure, prior to rotating the substrate. The dark lines 412 are the regions of constructive interference and maximum light intensity, the unshaded lines 414 between the dark lines 412 are the regions of destructive interference and minimum light intensity. For typical laser wavelengths currently in use of, for example for $\lambda=248$ nm (nanometers), 193 nm or 157 nm, the width of the dark or light lines would be nearly ¼ of a wavelength, respectively, 64 nm, 48 nm and 39 nm, as $\theta$ approached 90°. This small size allows the formation of correspondingly small features in the photoresist 400.

FIG. 5b shows the result of rotating the substrate through 90° and superimposing upon the first pattern a second interference pattern, identical to the first, which will be called the y-direction pattern. The lines of maximum 416 and minimum 418 intensity formed on the rotated photoresist 400 intersect the original lines 412 and 414 at 90° angles. The regions 420 at which two dark lines intersect are regions at which the photoresist 400 is subjected to its maximum exposure. The remaining totally unshaded regions 422 are regions at which the photoresist 400 is totally unexposed. When the photoresist is of the negative type, subsequent development would remove unexposed areas. If the process were terminated at this point, therefore, and the photoresist were developed, a symmetric and regular array of holes would be produced at the unexposed locations of photoresist 422. These holes would allow corresponding holes to be formed in the substrate 400. Further exposure allows the development of only a selected portion of the regular pattern of unexposed regions to be developed.

Figure 6B:
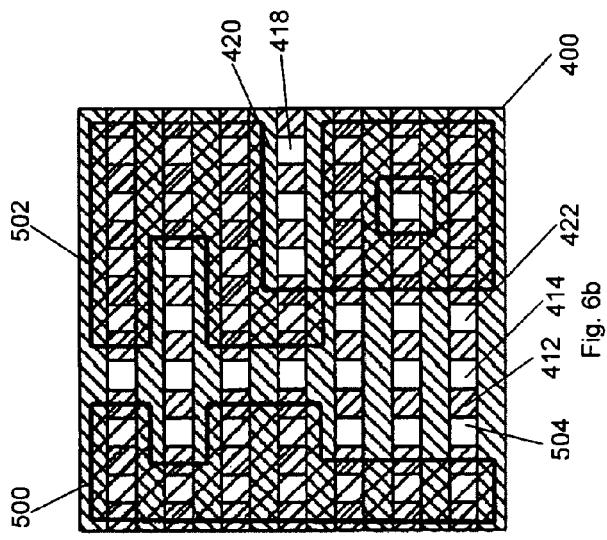
FIGS. 6a, 6b, and 6c are schematic diagrams showing: (a) a non-critical mask designed so as to produce a pattern on the photoresist; (b) the design pattern superimposed on the intersecting interference patterns so as to delineate the region of desired holes; (c) the mask placed on the photoresist.
Figure 6C:
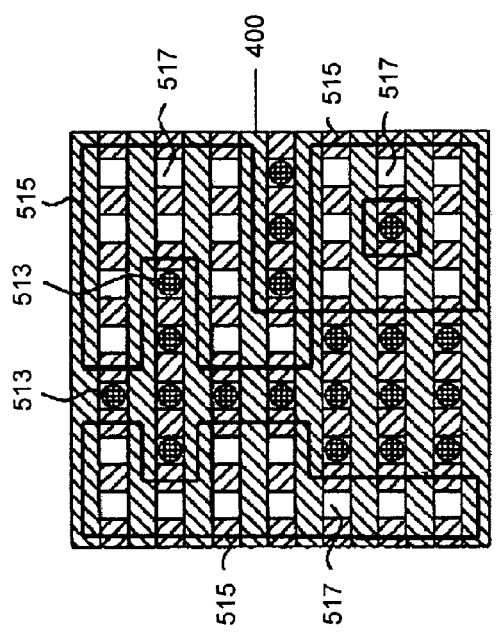
Figure 6A:
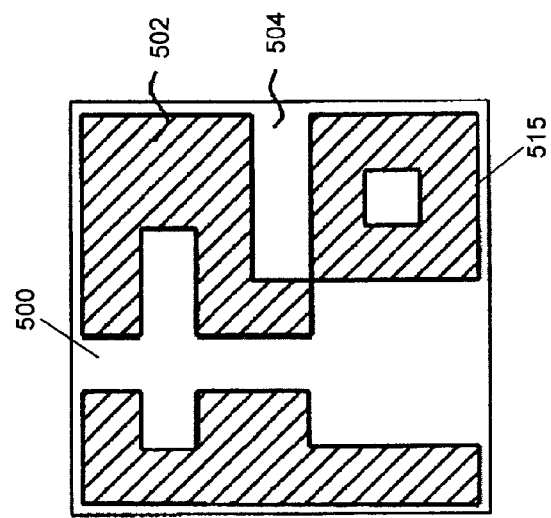

Referring next to FIGS. 6a-6c, there is shown the design of a non-critical mask 500 that is appropriate to producing a final set of desired holes from the crossed interference patterns of FIG. 5b. The mask 500 includes the dark regions 502 which are transparent, and the light regions 504 which are opaque, for example formed of chrome. The dark circles 513 drawn in the unexposed regions represent the desired final hole locations. The linear pattern 515 is the pattern of the mask shape 500 required to expose the regions which would become unwanted holes 517. It is to be noted that role of the mask is to retain the desired portions of the array of interferometrically produced holes. It is therefore contemplated to use masks of different types, including transparent and opaque optical masks, photostepping devices (photosteppers) and scanning devices. It is also contemplated to use masks that are placed on the substrate or above the substrate. Since the masks are non-critical, optical proximity correction need not be made.

FIGS. 6b and 6c show, schematically, the placement of the mask 500 of FIG. 6a over the photoresist of FIG. 5b. A final exposure of the photoresist through the mask, using conventional (non-interferometric) exposure methods can now be applied.

Referring now to FIG. 7, there is shown the photoresist 600 subsequent to its development. Assuming a negative photoresist medium, the unexposed areas, being more soluble, have been removed by the development process, leaving the desired holes (dark circles) 611 in their place. The less soluble exposed areas beneath the mask openings contained all the previously unexposed regions that would have produced unwanted holes in the final pattern. In one embodiment, an array of 0.22 micron holes may be obtained using a laser wavelength of approximately 457.9 nm.

Referring to FIG. 8a, there is schematically illustrated an alternative embodiment in which a molecularly cross-linked positive photoresist is used. This specially prepared photoresist can be developed to produce a reversed image from that of a normal positive photoresist by post-baking the resist after the patterned exposure to produce the cross-linkages and then flooding the photoresist with UV-light. FIG. 8a shows a side cross-sectional view of a substrate 702 on which has been deposited by a method such as spin coating a positive photoresist 703, for example HPR204 made by Fuji-Olin, to which has been added approximately 3% imidazole by weight. The coated substrate is then prebaked at approximately 85° C. for approximately 20 min. FIG. 8b shows incident radiation 704 (arrows) forming exposed regions 705 in a pattern such as would be produced interferometrically by the method of one or more of the above described embodiments. The patterned photoresist is then post-baked for approximately 30 minutes at approximately 100° C. to cross-link the exposed resist. FIG. 8c shows the post-baked photoresist regions 705 being subjected uniformly to UV-light 706 (arrows), rendering the already exposed region 705 very insoluble under the subsequent development process. FIG. 8d shows the developed photoresist regions 705 with the unexposed portions 707 of the photoresist removed.

In another embodiment, the beam-splitting apparatus of FIG. 3 may be used instead of the apparatus of FIG. 1. In all other respects, the method of this embodiment would be practiced in accord with the above discussion regarding FIGS. 4-8d.

Figure 9:
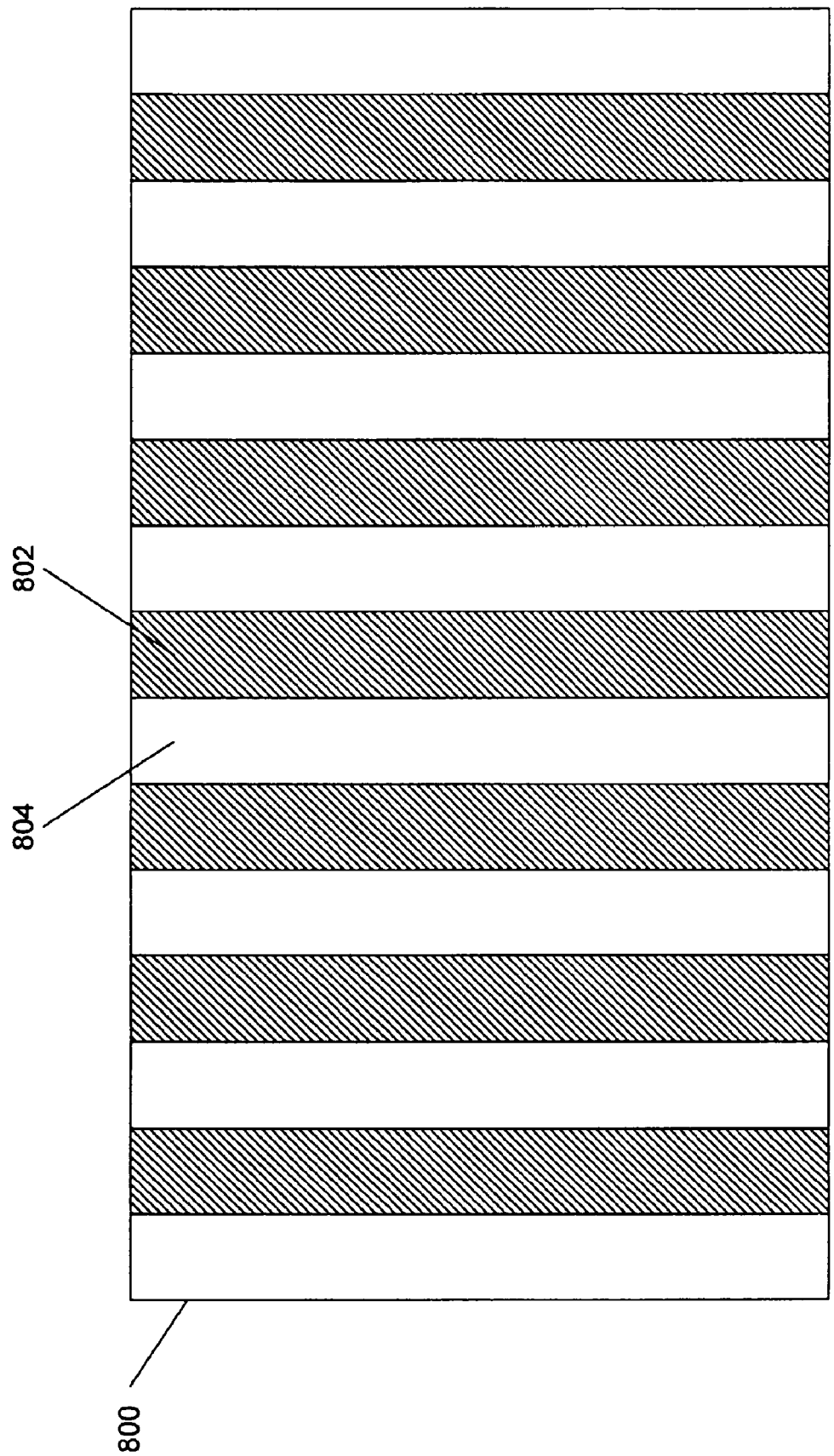
FIG. 9 is a schematic diagram showing an exemplary X-direction interference pattern on a positive photoresist.

In another embodiment, referring to FIG. 9, there is shown a schematic representation of interference fringes (interference maxima) formed as a result of the superposition of two coherent laser beams impinging upon a positive photoresist 800. The beams may be produced, for example, using the apparatus 5 of FIG. 1 or the apparatus 200 of FIG. 3. The exposed fringe areas are formed in photoresist 800 and indicated as unshaded areas 804, while the unexposed regions representing locations where destructive interference occurred are indicated as shaded areas 802.

Figure 10:
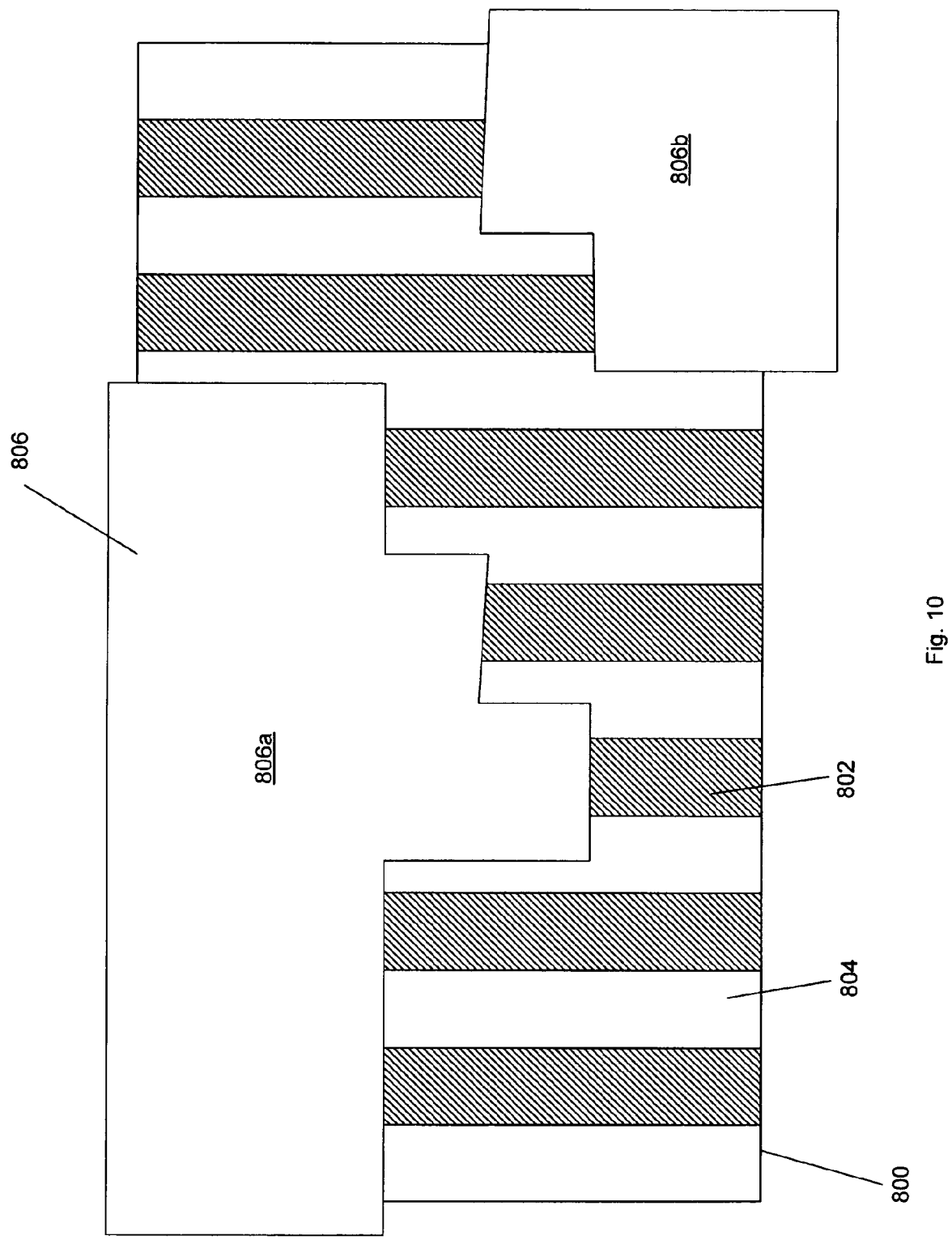
FIG. 10 is a schematic diagram showing the masking of the X-direction interference pattern of FIG. 9.

Referring to FIG. 10, a mask 806 having opaque mask portions 806a and 806b is placed over portions of the photoresist 800. Mask portions 806a and 806b cover desired portions of unexposed areas 802. This enables undesired portions of the photoresist 800 to be trimmed from the pattern.

Figure 11:
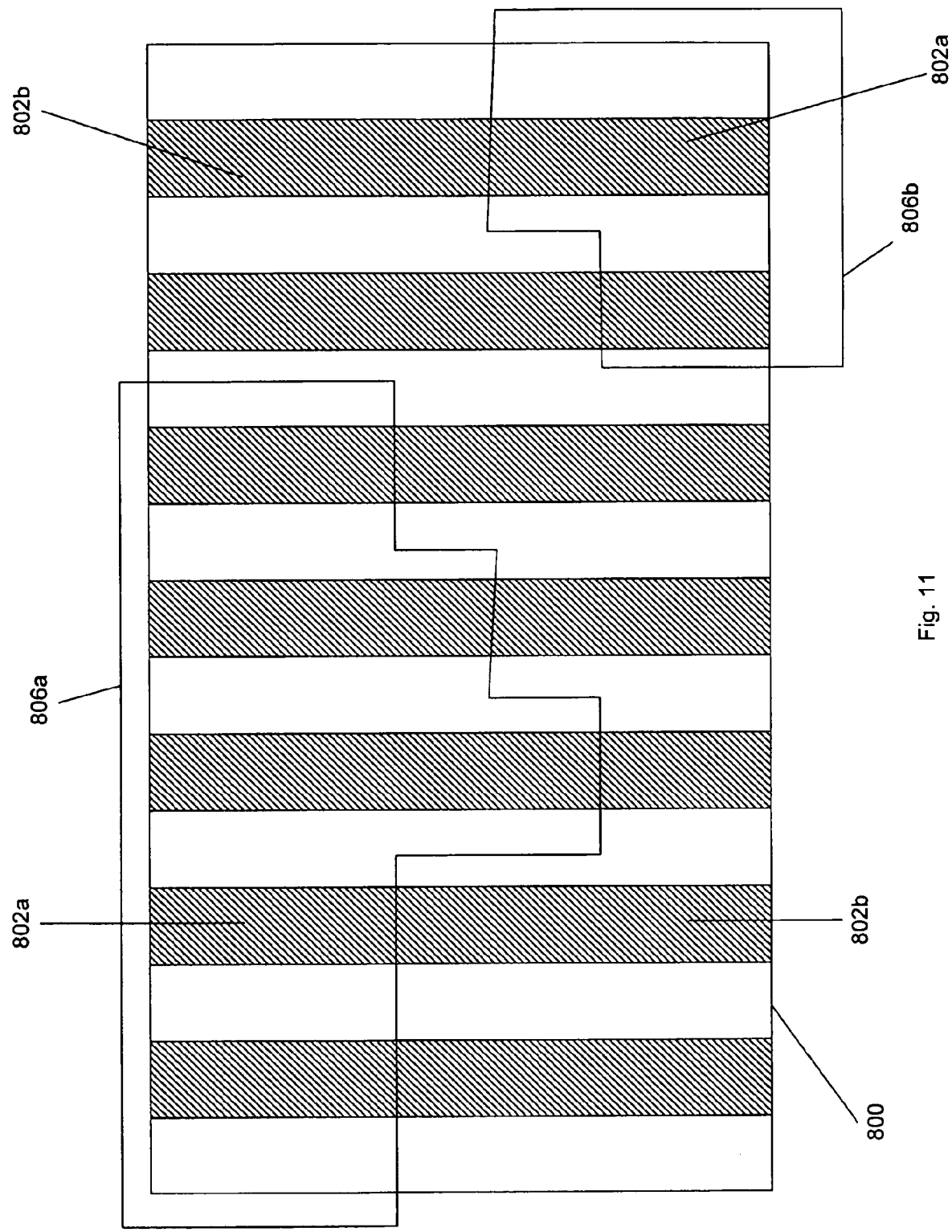
FIG. 11 is a schematic diagram showing the masking of the X-direction interference pattern of FIG. 9 with a transparent mask to illustrate the underlying pattern.

Referring to FIG. 11, a transparent view of the mask 806 is provided. This reveals portions 802a that will remain unexposed, and portions 802b that will be exposed after a light source is applied to photoresist 800.

Figure 12:
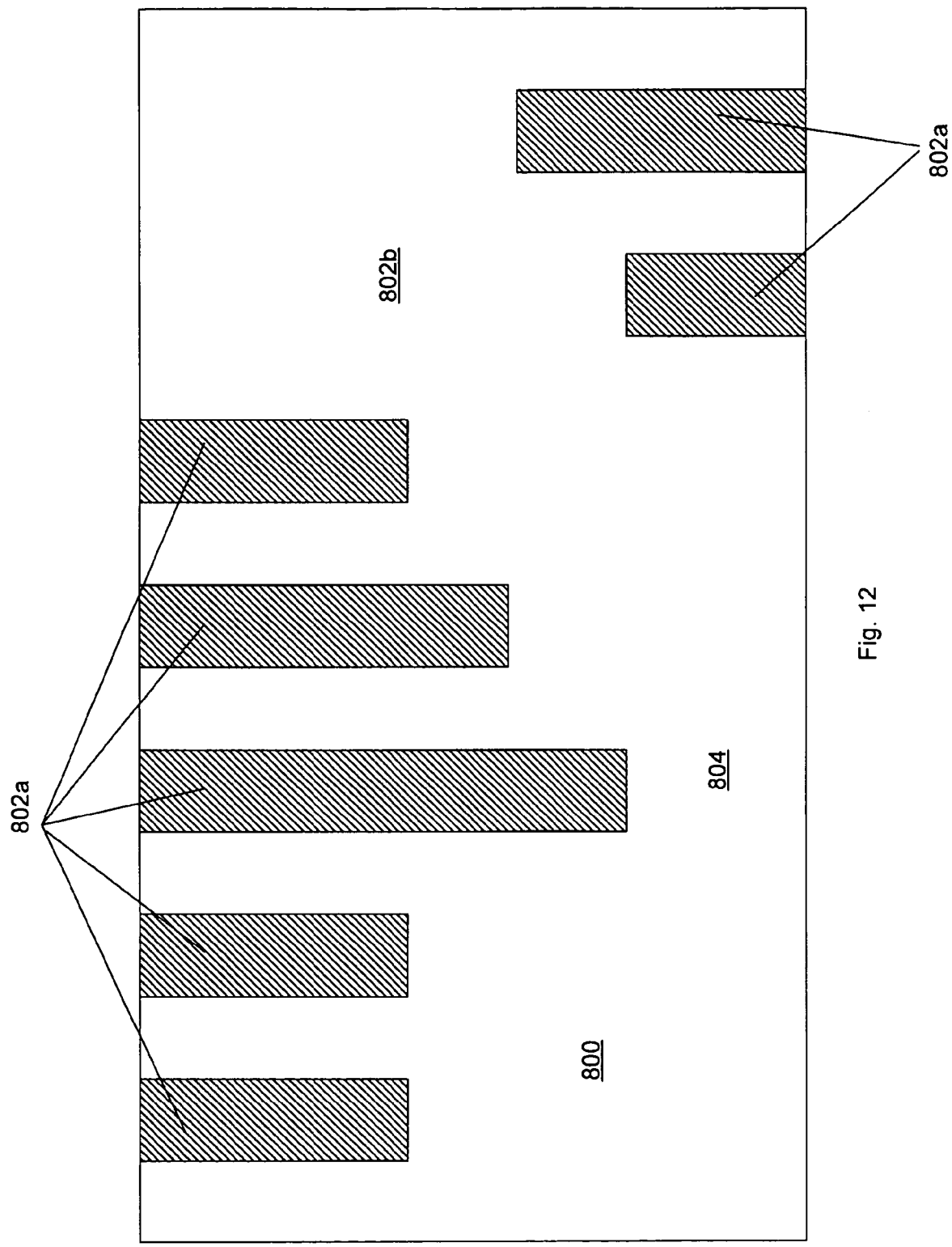
FIG. 12 is a schematic diagram showing the remaining X-direction interference pattern of FIG. 9 after the masking of FIG. 10.

Referring to FIG. 12, the photoresist 800 is shown after a light source has been applied and photoresist 800 has been developed. Only the unexposed regions 802a which were covered by mask portions 806a or 806b remain as the patterned photoresist or resist image, while the remainder 802b and 804 of the photoresist 800 is removed in the developing process, in a conventional manner.

Figure 13:
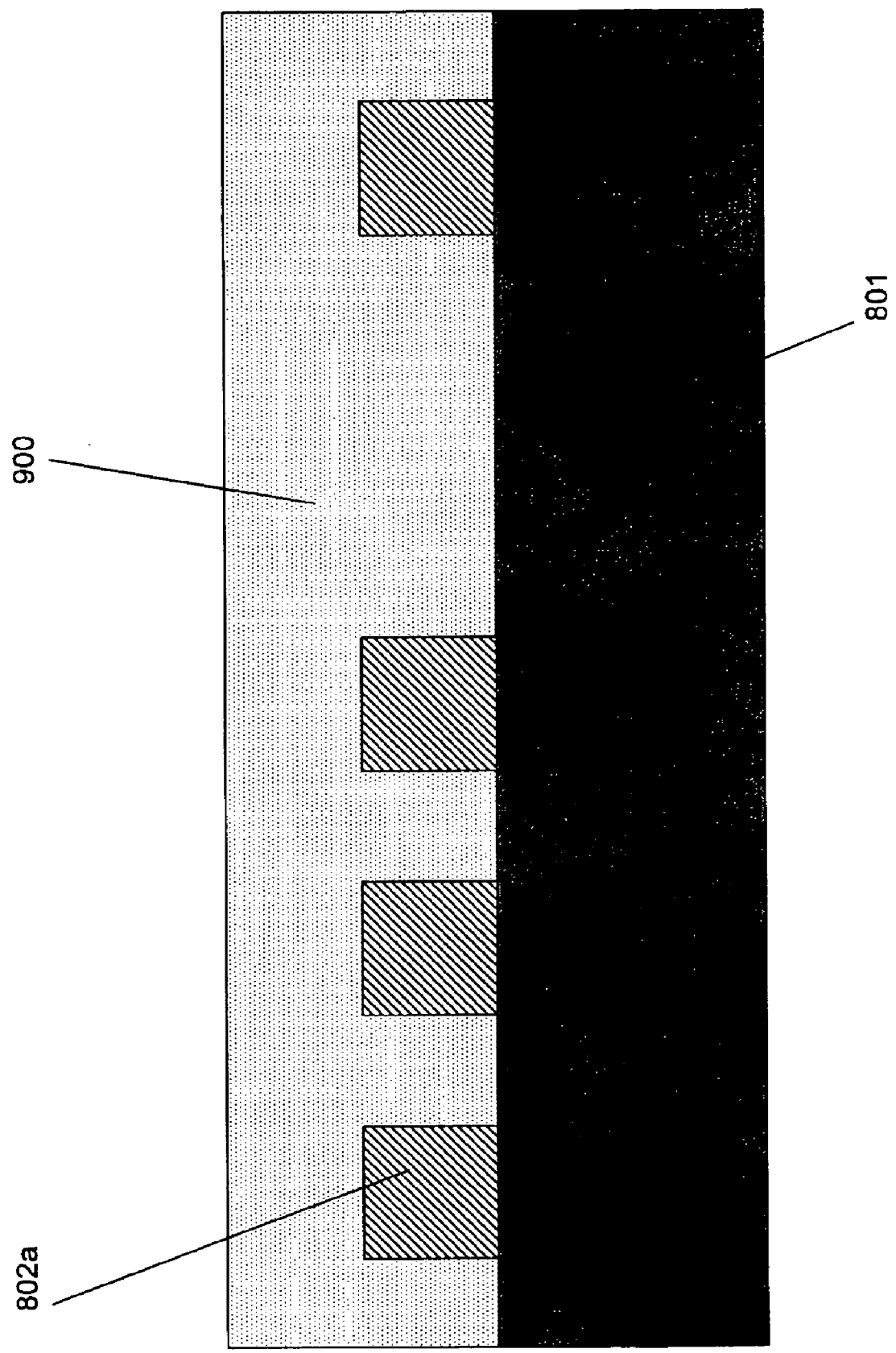
FIG. 13 is a cross-sectional view showing a coat of photoresist applied to the X-direction interference pattern of FIG. 12.

Referring to FIG. 13, a cross-sectional view of a substrate 801 is shown with patterned photoresist 802a which has been patterned and hardened in a conventional manner. For example, the hardening may be accomplished by treating the patterned photoresist 802a with UV radiation, or by using an implant process or a chemical treatment. This protects the patterned photoresist 802a during later processing steps. Another layer of positive photoresist 900 is applied over substrate 801 and patterned photoresist 802a.

Figure 14:
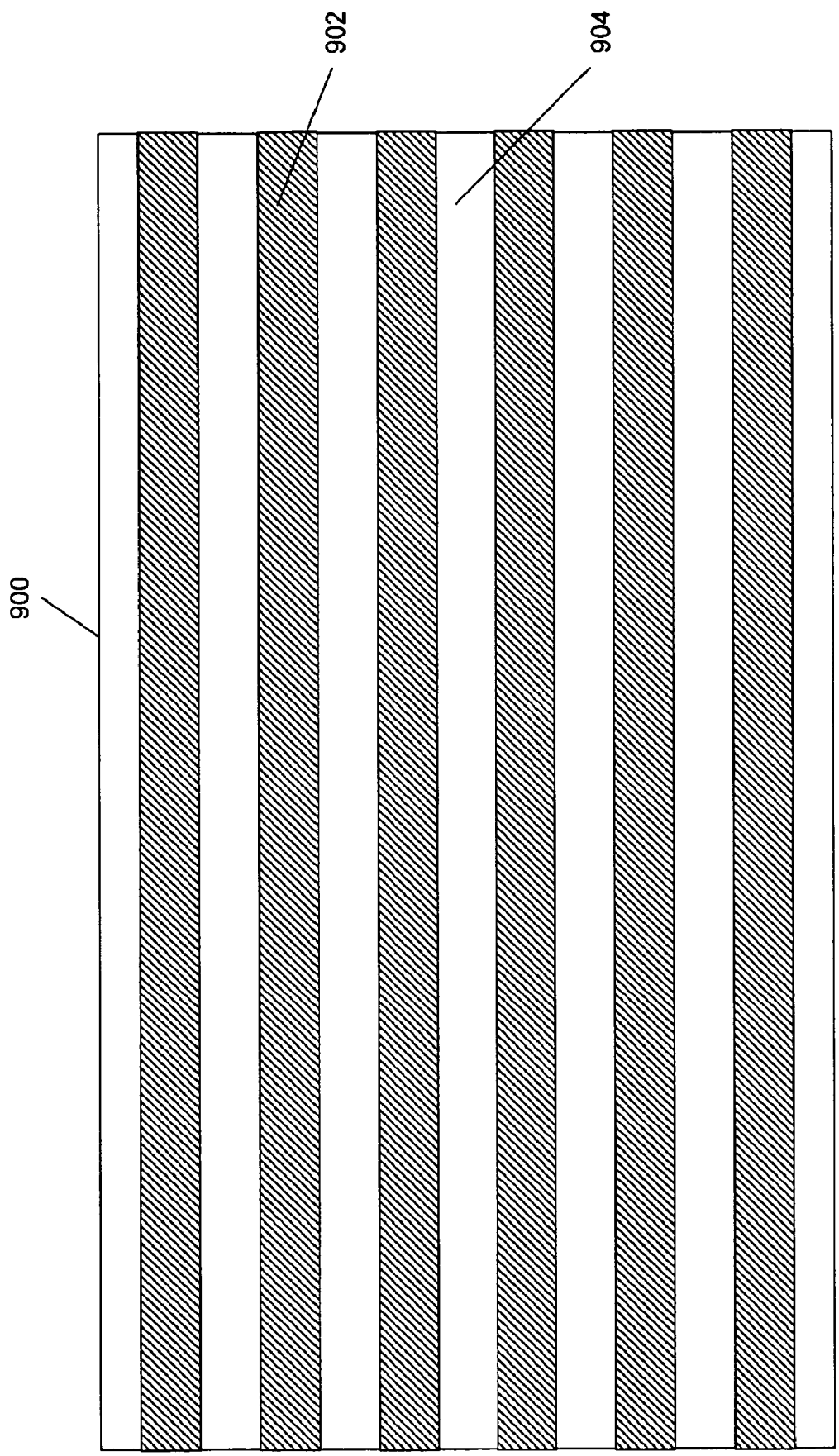
FIG. 14 is a schematic diagram showing a Y-direction interference pattern.

Referring to FIG. 14, there is shown a schematic representation of interference fringes (interference maxima) formed as a result of the superposition of two coherent laser beams impinging upon positive photoresist 900. The beams may be produced, for example, using the apparatus 5 of FIG. 1 or the apparatus 200 of FIG. 3. The exposed fringe areas are formed in photoresist 900 and indicated as unshaded areas 904, while unexposed regions caused by destructive interference are indicated as shaded areas 902. It is understood that, prior to the formation of the exposed fringe areas, the substrate may be rotated through an angle θ about the normal to the substrate's surface. In the present example, the angle θ is 90 degrees, but other angles may be used to achieve a desired orientation of the exposed fringe areas. Furthermore, in addition to or in place of such rotation, the substrate may be moved in other directions (e.g., along the x-axis or y-axis) to provide an offset.

Figure 15:
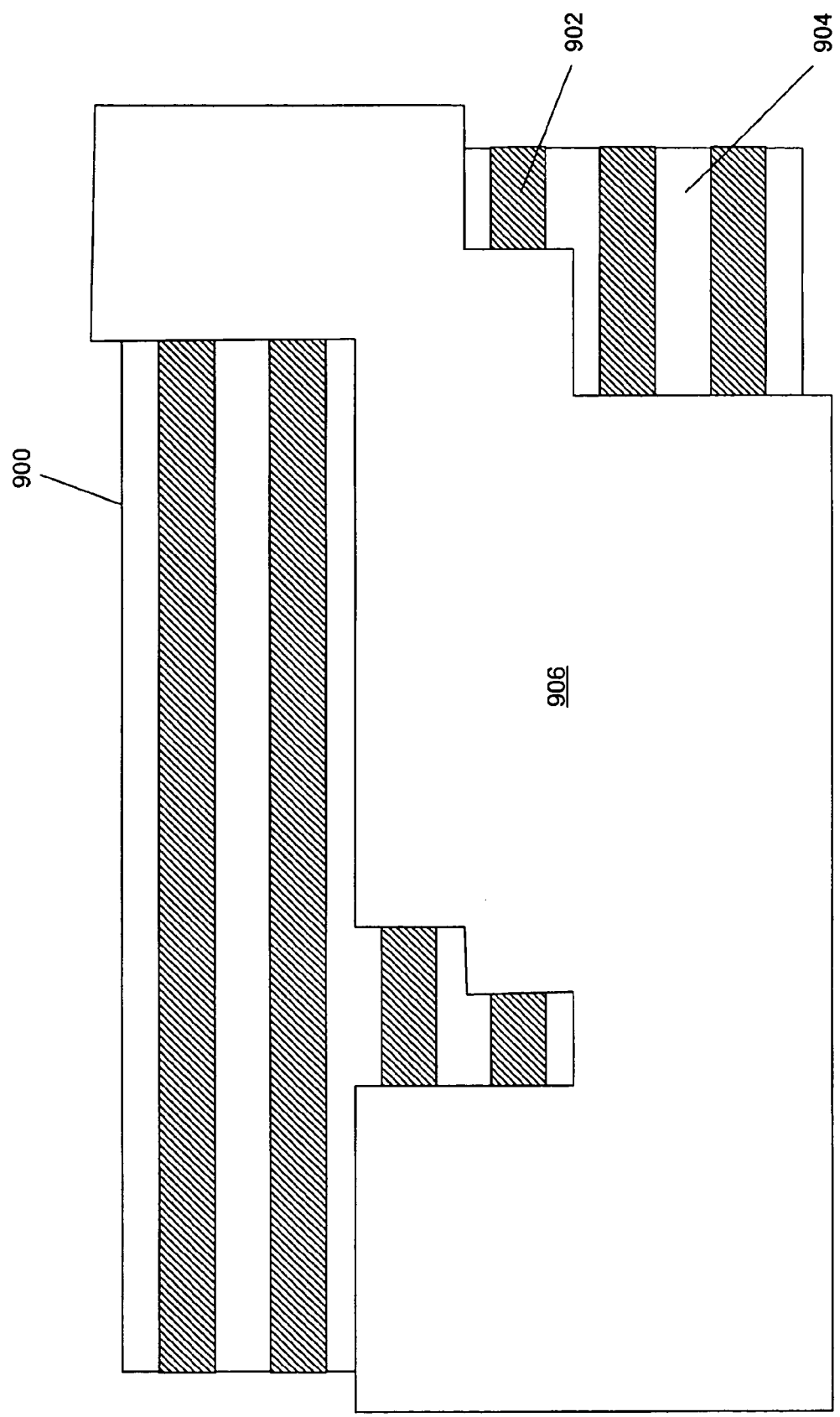
FIG. 15 is a schematic diagram showing the masking of the Y-direction interference pattern of FIG. 14.

Referring to FIG. 15, an opaque mask 906 is placed over portions of the photoresist 900. Opaque mask 906 covers desired portions of unexposed areas 902. This enables undesired portions of the photoresist 900 to be trimmed from the pattern.

Figure 16:
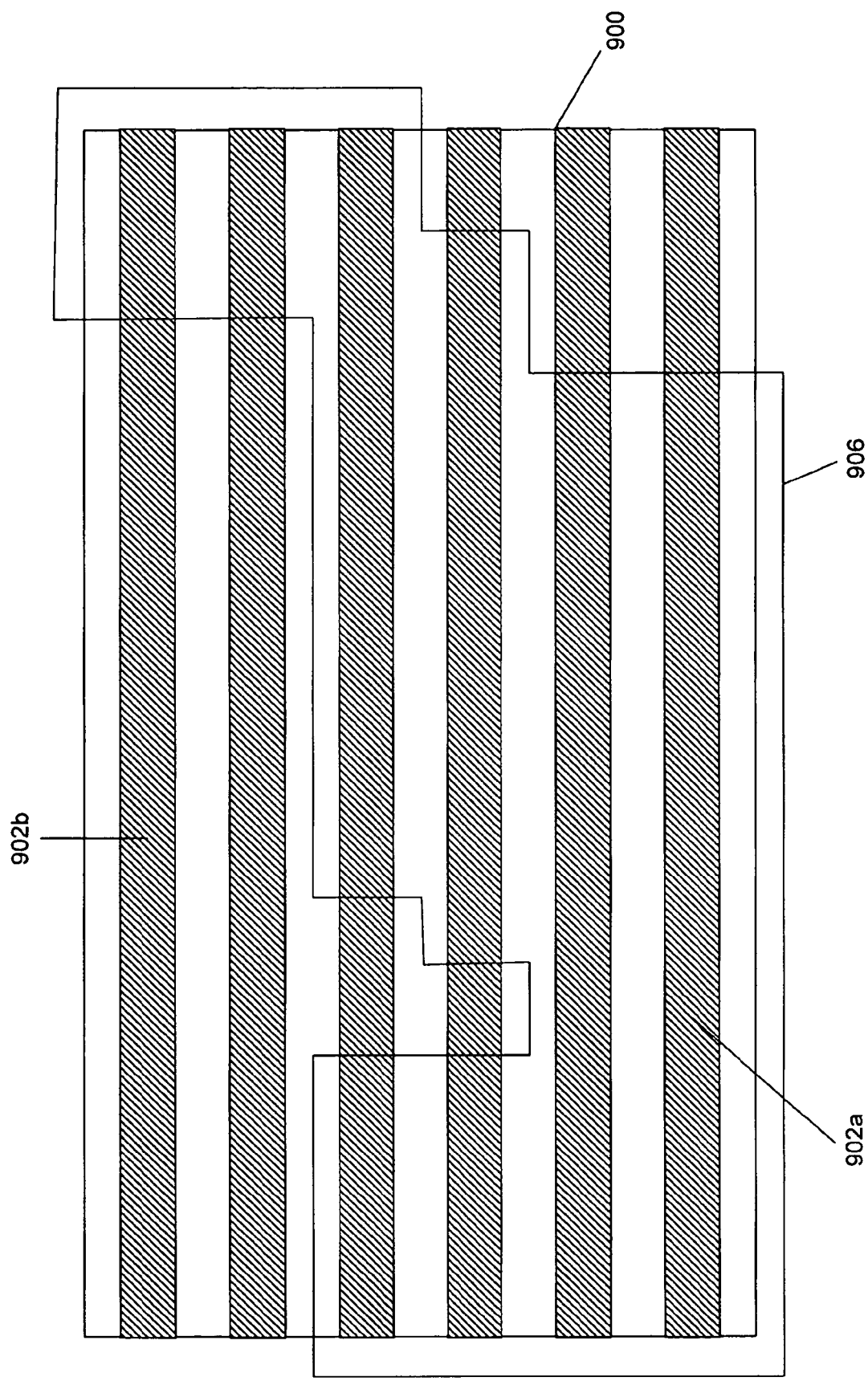
FIG. 16 is a schematic diagram showing the masking of the Y-direction interference pattern of FIG. 14 with a transparent mask to illustrate the underlying pattern.

Referring to FIG. 16, a transparent view of the mask 906 is provided. This reveals portions 902a that will remain unexposed, and portions 902b that will be exposed after a light source is applied to photoresist 900.

Figure 17:
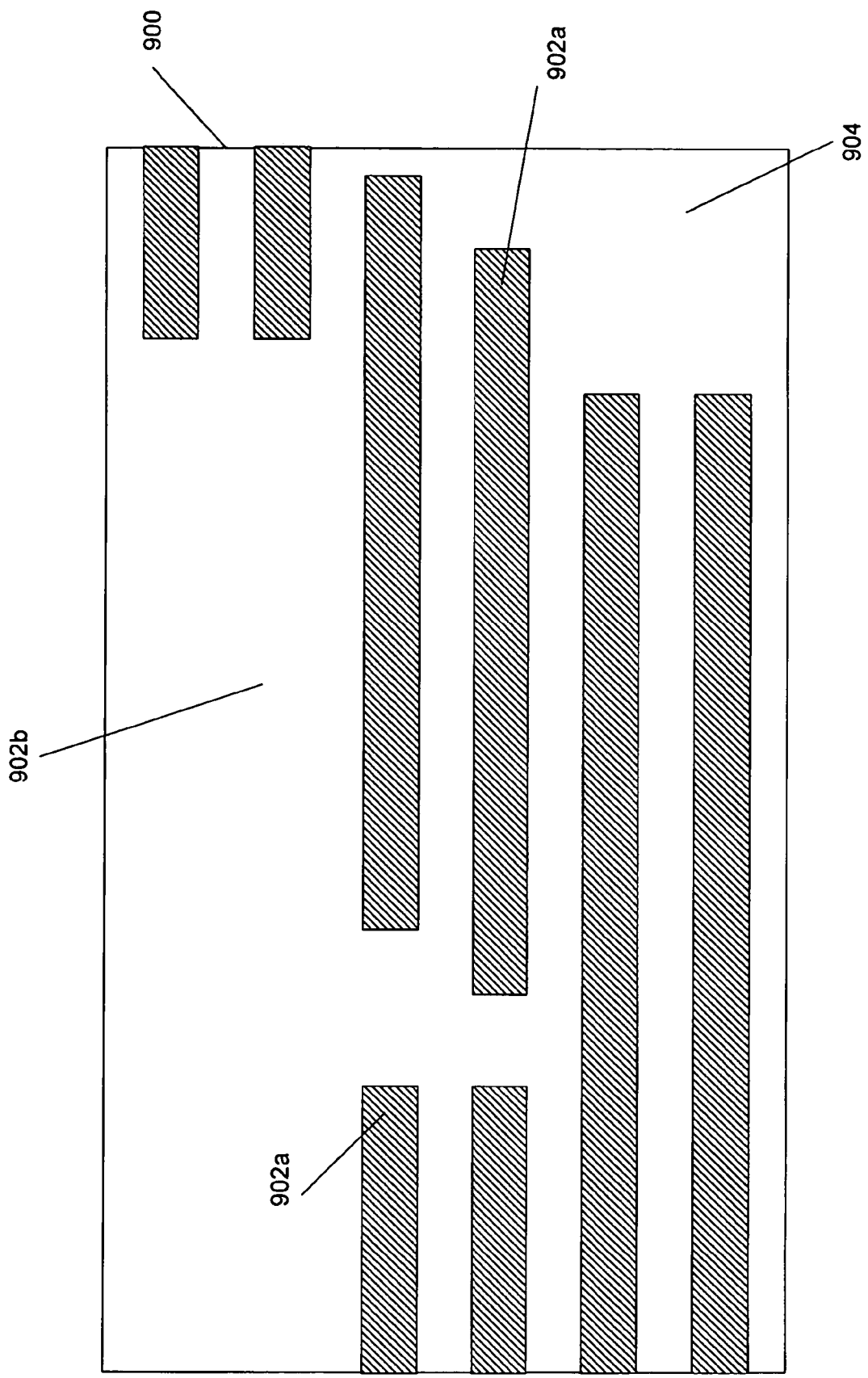
FIG. 17 is a schematic diagram showing the remaining Y-direction interference pattern of FIG. 14 after the masking of FIG. 15.

Referring to FIG. 17, the photoresist 900 is shown after a light source has been applied and photoresist 900 has been developed. Only the unexposed regions 902a which were covered by the mask 906 remain as the patterned photoresist or resist image, while the remainder 902b and 904 of the photoresist 900 is removed in the developing process in a conventional manner.

Figure 18:
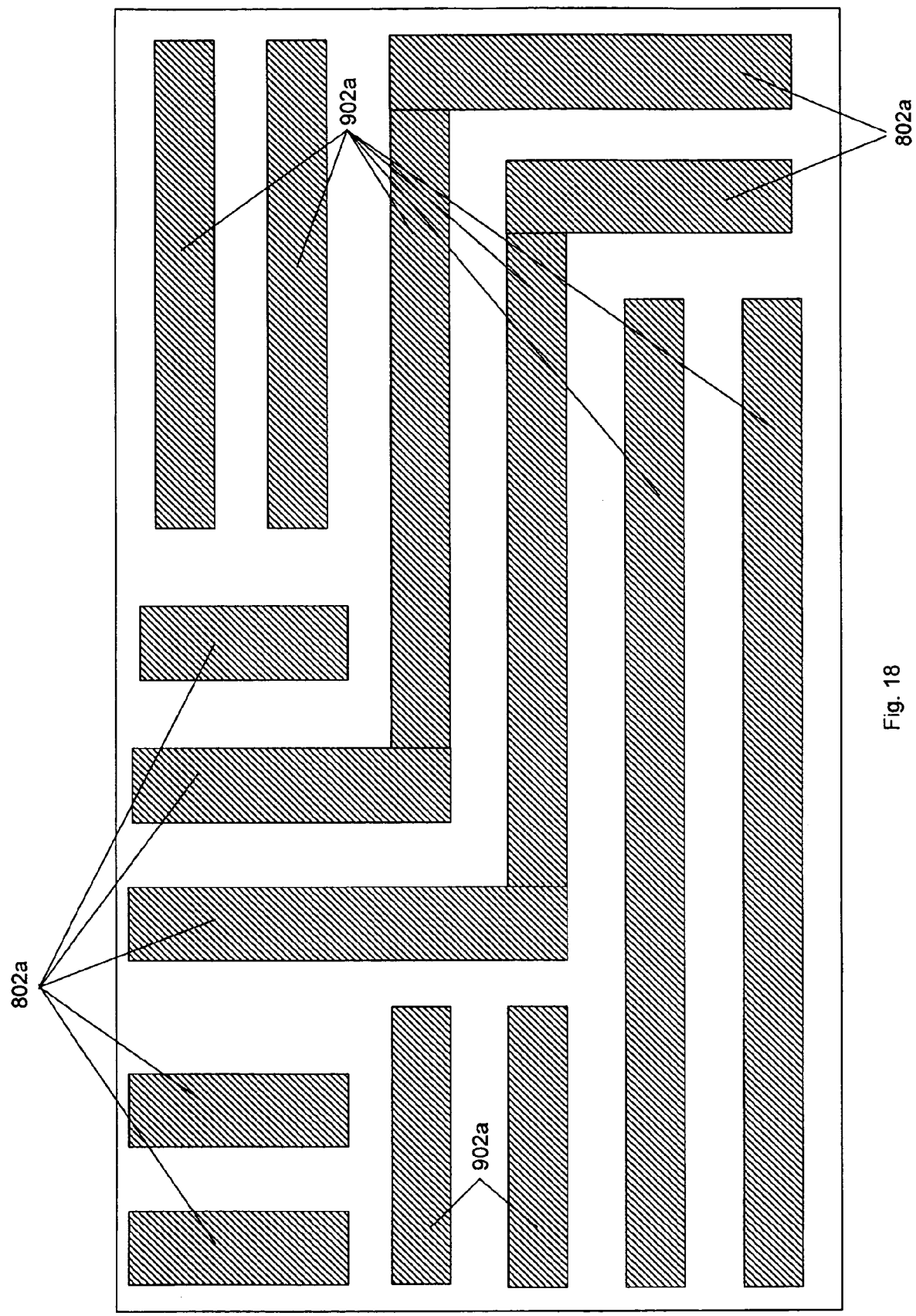
FIG. 18 is a schematic diagram showing the Y-direction interference pattern of FIG. 17 combined with the X-direction interference pattern of FIG. 12.

Referring to FIG. 18, the photoresist 800 (represented by remaining unexposed regions 802a) and 900 (represented by remaining unexposed regions 902a) are shown as a combined pattern. As illustrated, only unexposed regions 802a and unexposed regions 902a remain to form the desired patterned photoresist or resist image. Accordingly, the interference provided by the beams may be used to form patterns having multi-directional lines. The final combined resist patterns will then be transferred into the substrate by an etch process.

Figure 19:
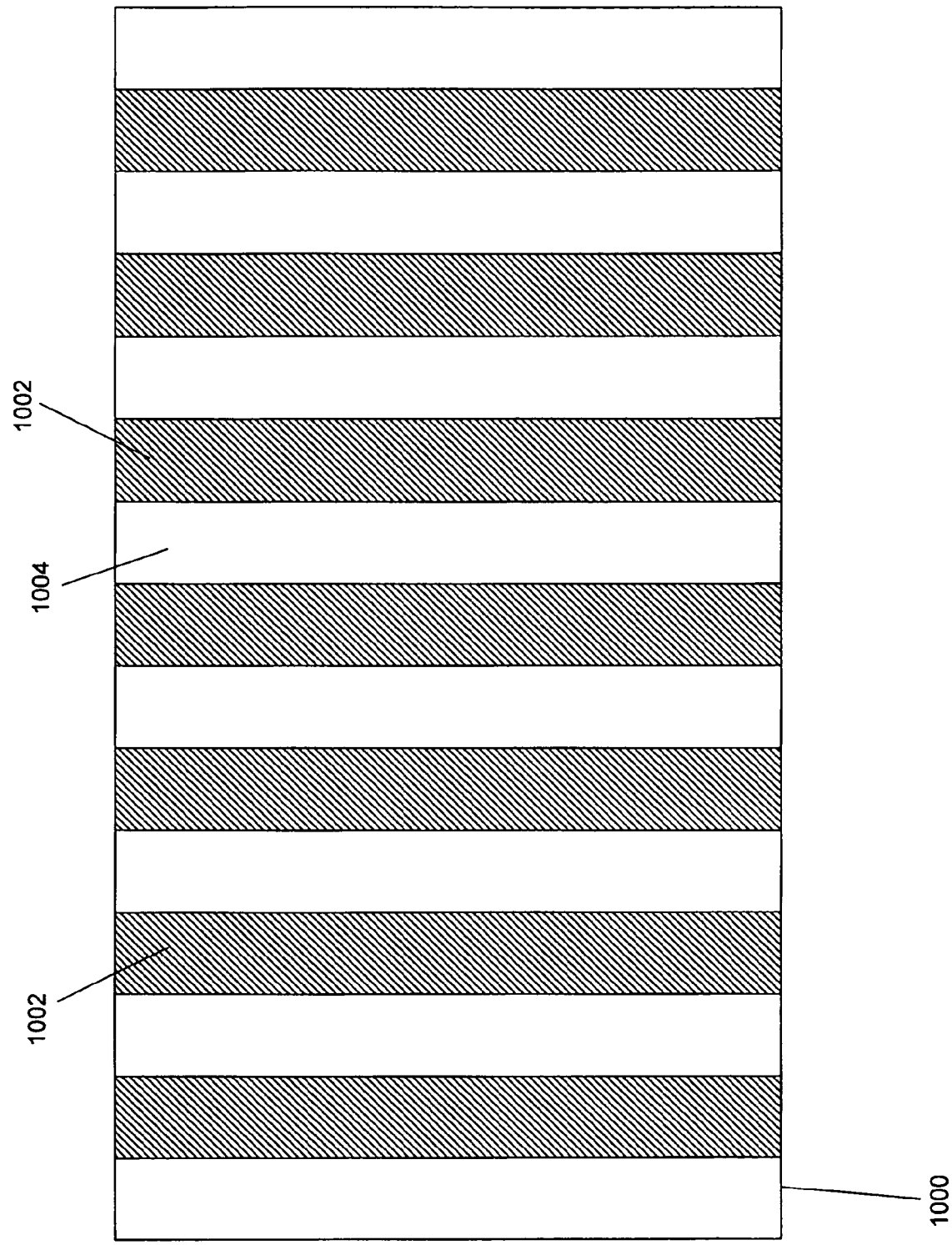
FIG. 19 is a schematic diagram showing an exemplary X-direction interference pattern on a negative photoresist.

In another embodiment, referring to FIG. 19, there is shown a schematic representation of interference fringes (interference maxima) formed as a result of the superposition of two coherent laser beams impinging upon a negative photoresist 1000. The beams may be produced, for example, using the apparatus 5 of FIG. 1 or the apparatus 200 of FIG. 3. The unexposed areas are formed in photoresist 1000 and indicated as unshaded areas 1004, while the exposed regions are indicated as shaded areas 1002.

Figure 20:
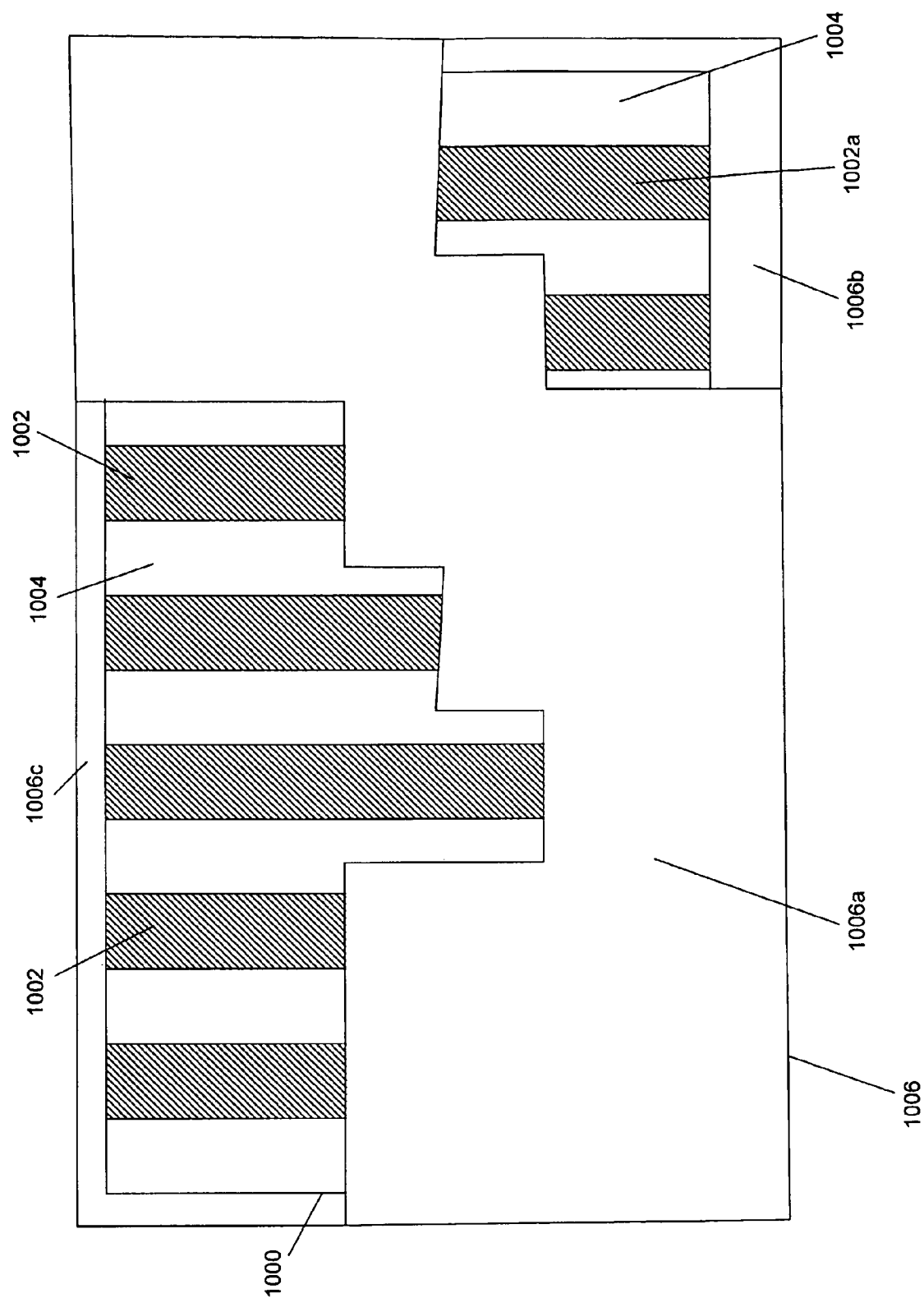
FIG. 20 is a schematic diagram showing the masking of the X-direction interference pattern of FIG. 19.

Referring to FIG. 20, a mask 1006 having a clear mask portion 1006a and opaque mask portions 1006b and 1006c is placed over the photoresist 1000. Mask portions 1006b and 1006c cover desired portions of exposed areas 1002. This enables undesired portions of the photoresist 1000 to be covered by fully exposed negative resist.

Figure 21:
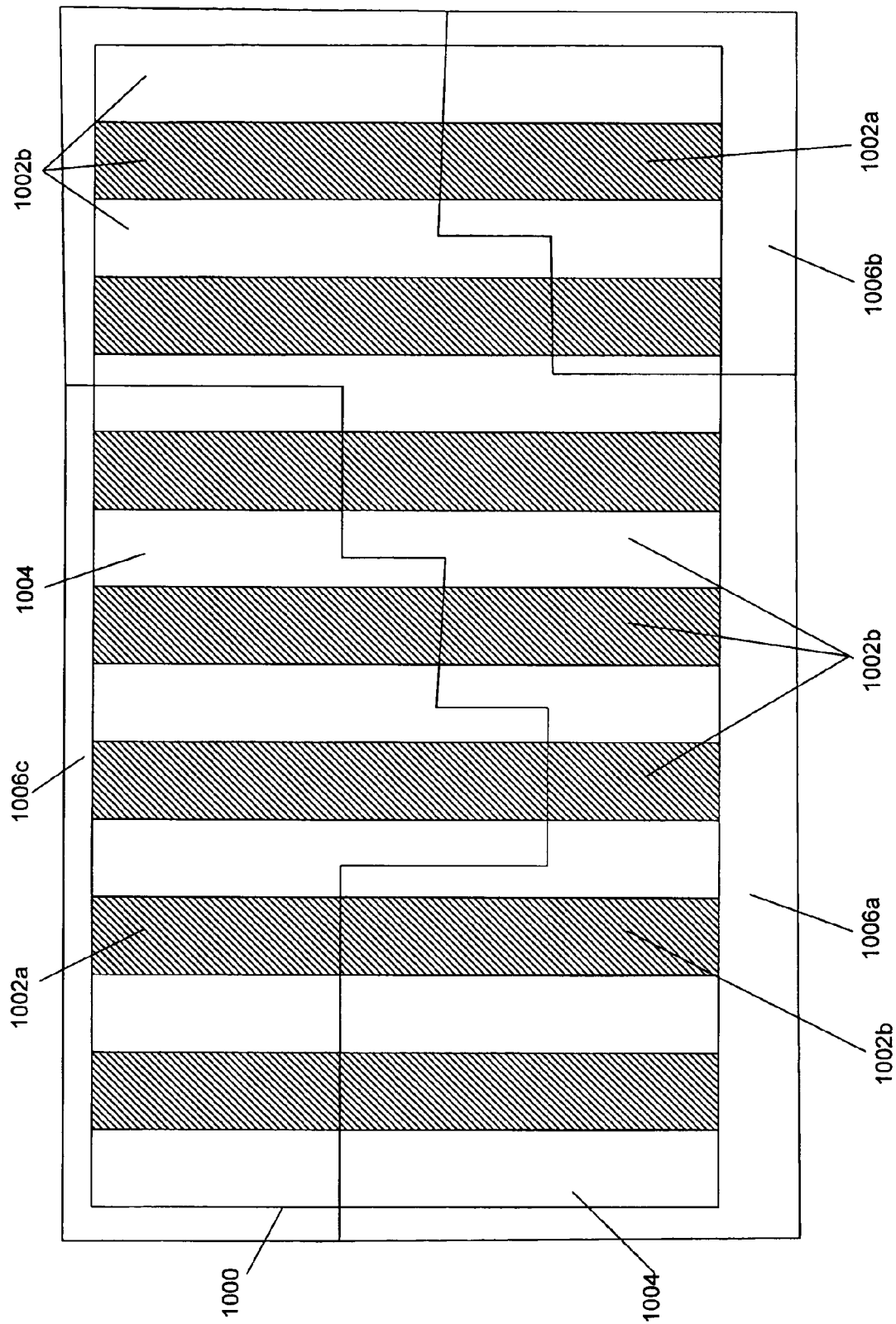
FIG. 21 is a schematic diagram showing the masking of the X-direction interference pattern of FIG. 19 with a transparent mask to illustrate the underlying pattern.

Referring to FIG. 21, a transparent view of the mask 1006 is provided. This reveals portions 1002a of 1006b and 1006c that will be unexposed, and portions 1002b of 1006a that will be exposed after a light source is applied to photoresist 1000.

Figure 22:
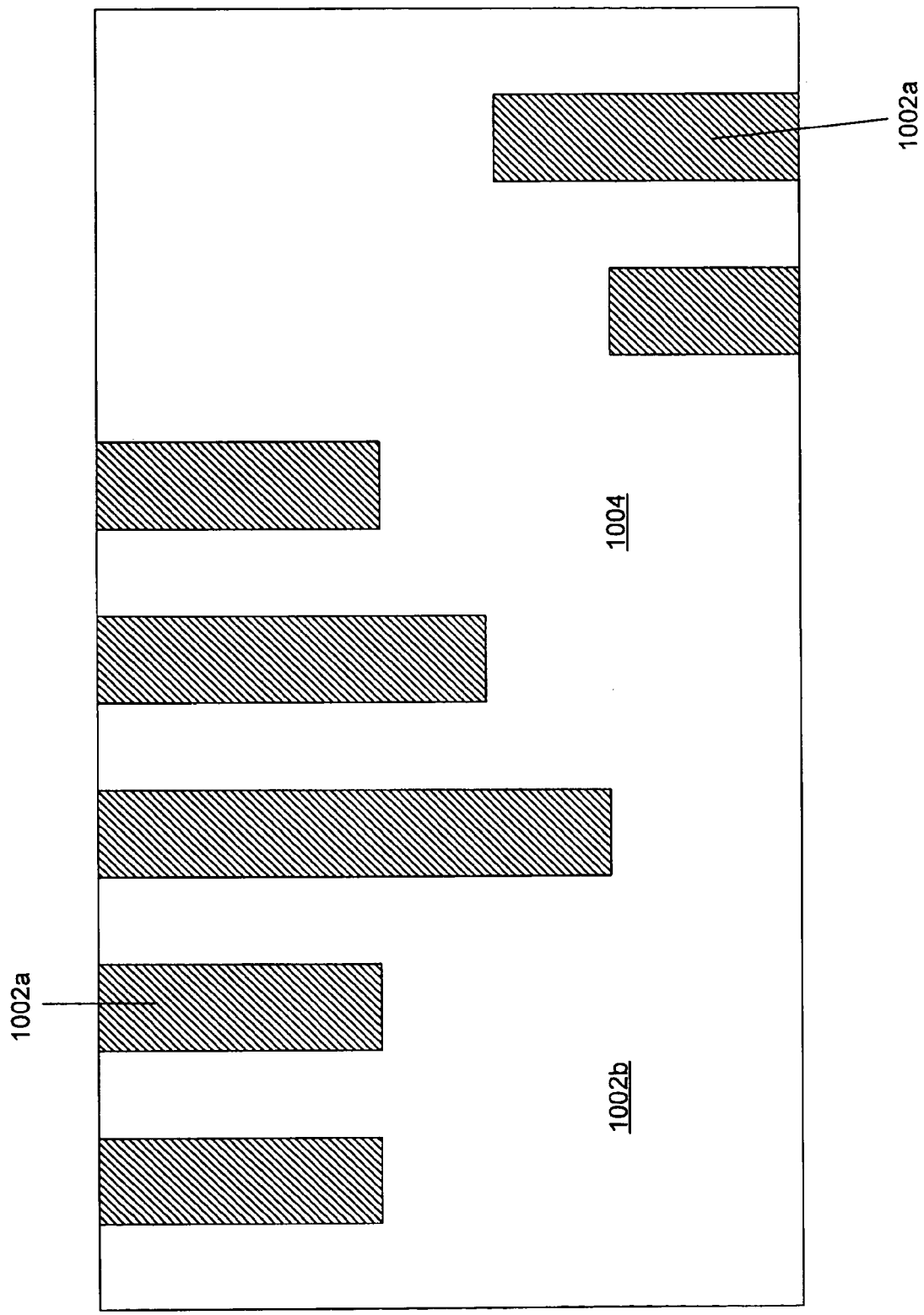
FIG. 22 is a schematic diagram showing the remaining X-direction interference pattern of FIG. 9 after the masking of FIG. 20.

Referring to FIG. 22, the photoresist 1000 is shown after a light source has been applied, and photoresist 1000 has been developed. The unexposed regions 1002a which were covered by opaque mask portions 1006b or 1006c remain as the patterned photoresist or resist image, while the remainder 1002b and 1004 of the exposed photoresist 1000 is fully covered by exposed negative resist without patterns.

Figure 23:
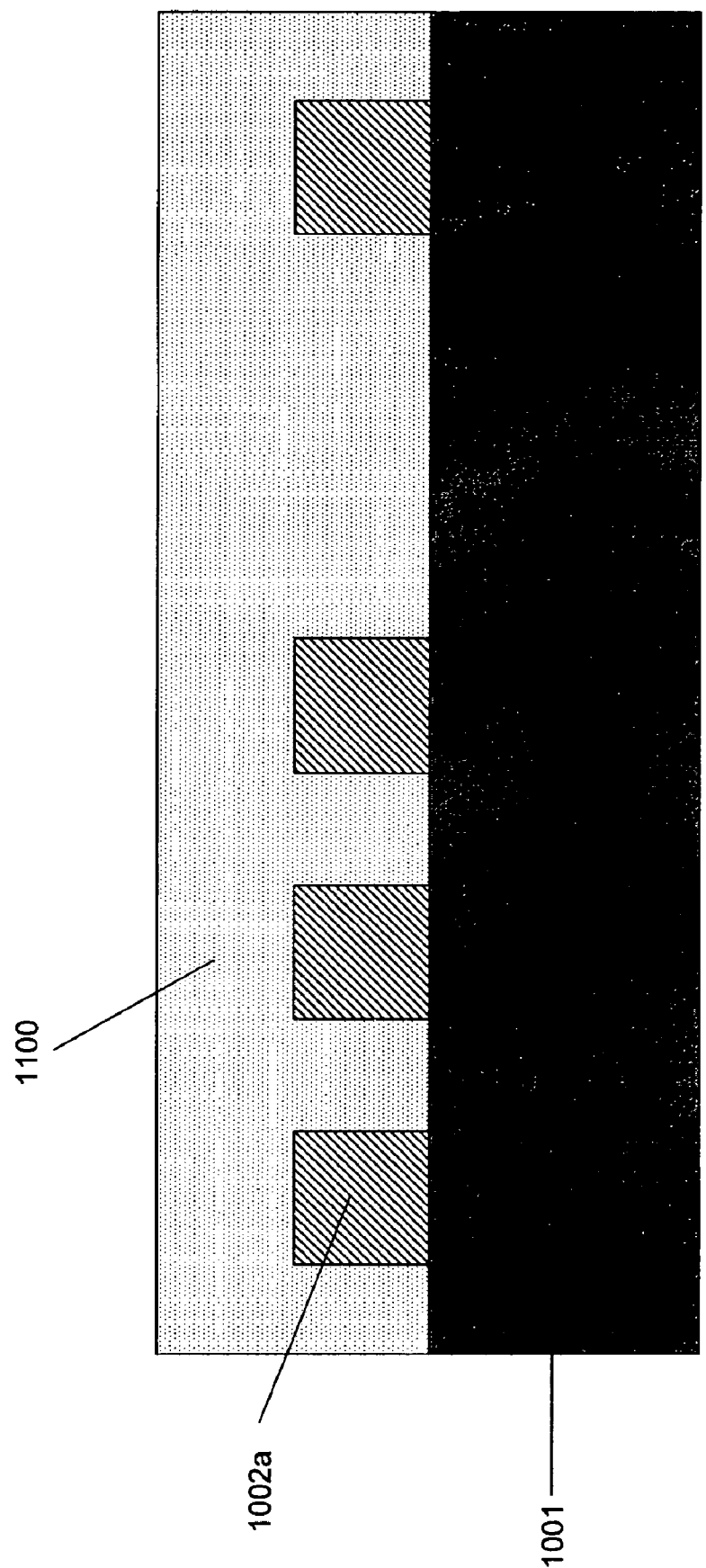
FIG. 23 is a cross-sectional view showing a coat of photoresist applied to the X-direction interference pattern etched on the substrate of FIG. 22.

Referring to FIG. 23, a cross-sectional view of a substrate 1001 is shown with a first direction image that has been patterned and etched through the substrate after the developing process. Resist residue is stripped after the etch process. Another layer of negative photoresist 1100 is applied over substrate 1001.

Figure 24:
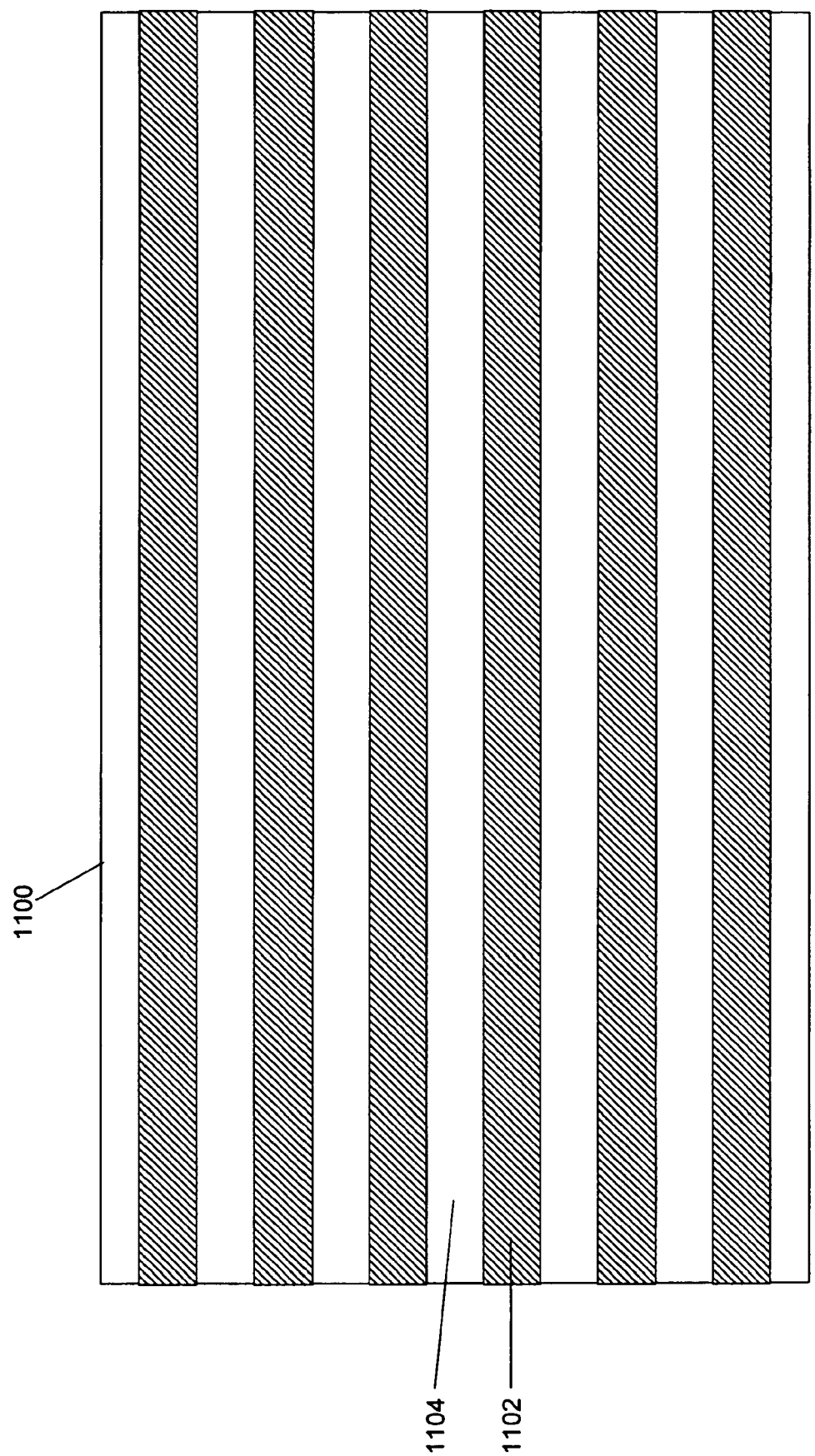
FIG. 24 is a schematic diagram showing a Y-direction interference pattern.

Referring to FIG. 24, after the resist strip process of the first direction patterning, the second direction patterns will be produced. As shown in FIG. 24, a schematic representation of interference fringes (interference maxima) is formed as a result of the superposition of two coherent laser beams impinging upon negative photoresist 1100. The beams may be produced, for example, using the apparatus 5 of FIG. 1 or the apparatus 200 of FIG. 3. The unexposed areas are formed in photoresist 1100 and indicated as unshaded areas 1104, while the exposed regions are indicated as shaded areas 1102. It is understood that, prior to the formation of the exposed fringe areas, the substrate may be rotated through an angle θ about the normal to the substrate's surface. In the present example, the angle θ is 90 degrees, but other angles may be used to achieve a desired orientation of the exposed fringe areas. Furthermore, in addition to or in place of such rotation, the substrate may be moved in other directions (e.g., along the x-axis or y-axis) to provide an offset.

Figure 25:
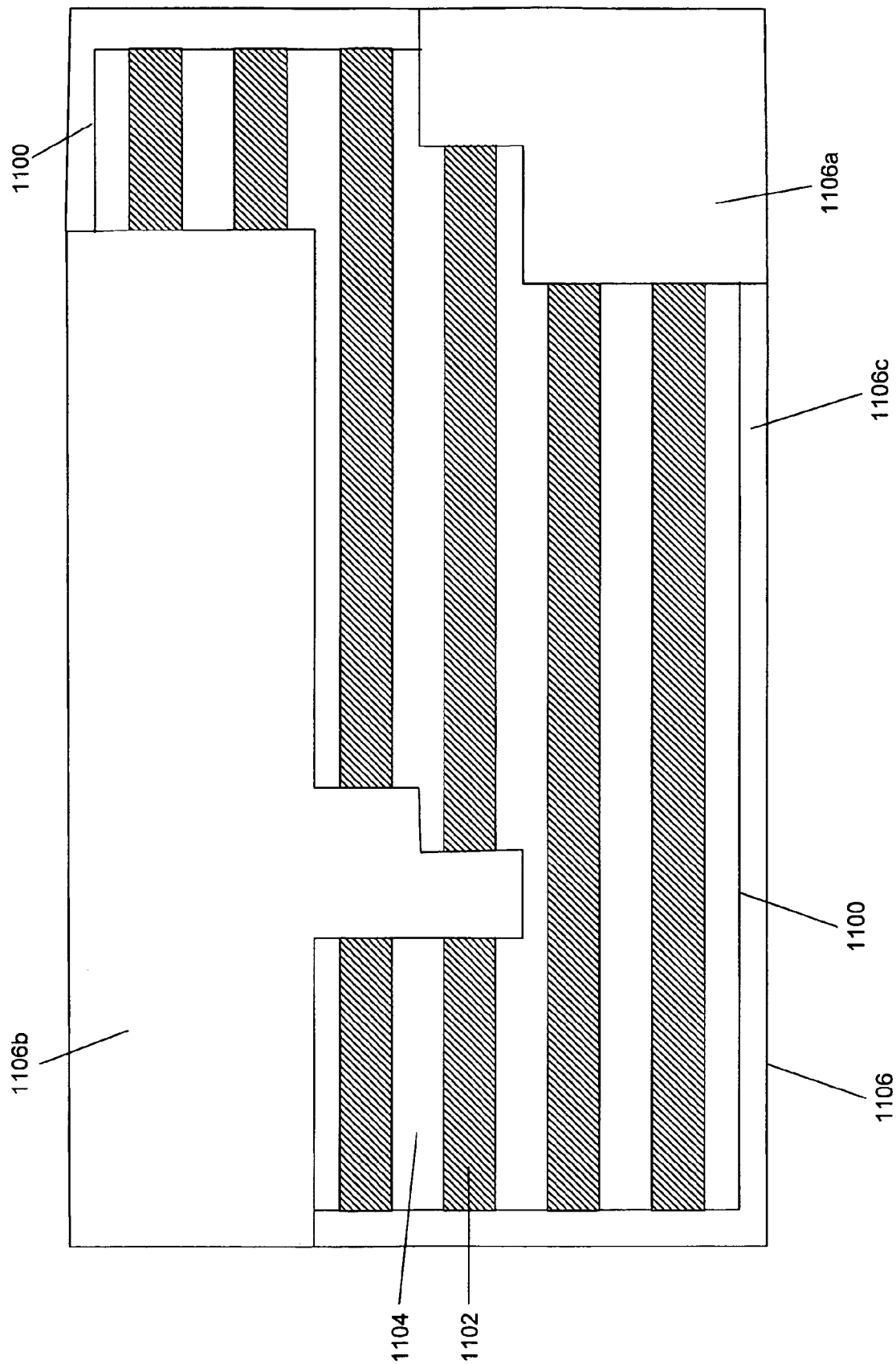
FIG. 25 is a schematic diagram showing the masking of the Y-direction interference pattern of FIG. 24.

Referring to FIG. 25, a mask 1106 having clear mask portions 1106a and 1106b and an opaque mask portion 1106c is placed over the photoresist 1100. Mask portion 1106c covers desired portions of exposed areas 1102/1104. This enables undesired portions of interference patterns 1106a and 1106b to be covered by fully exposed negative resist.

Figure 26:
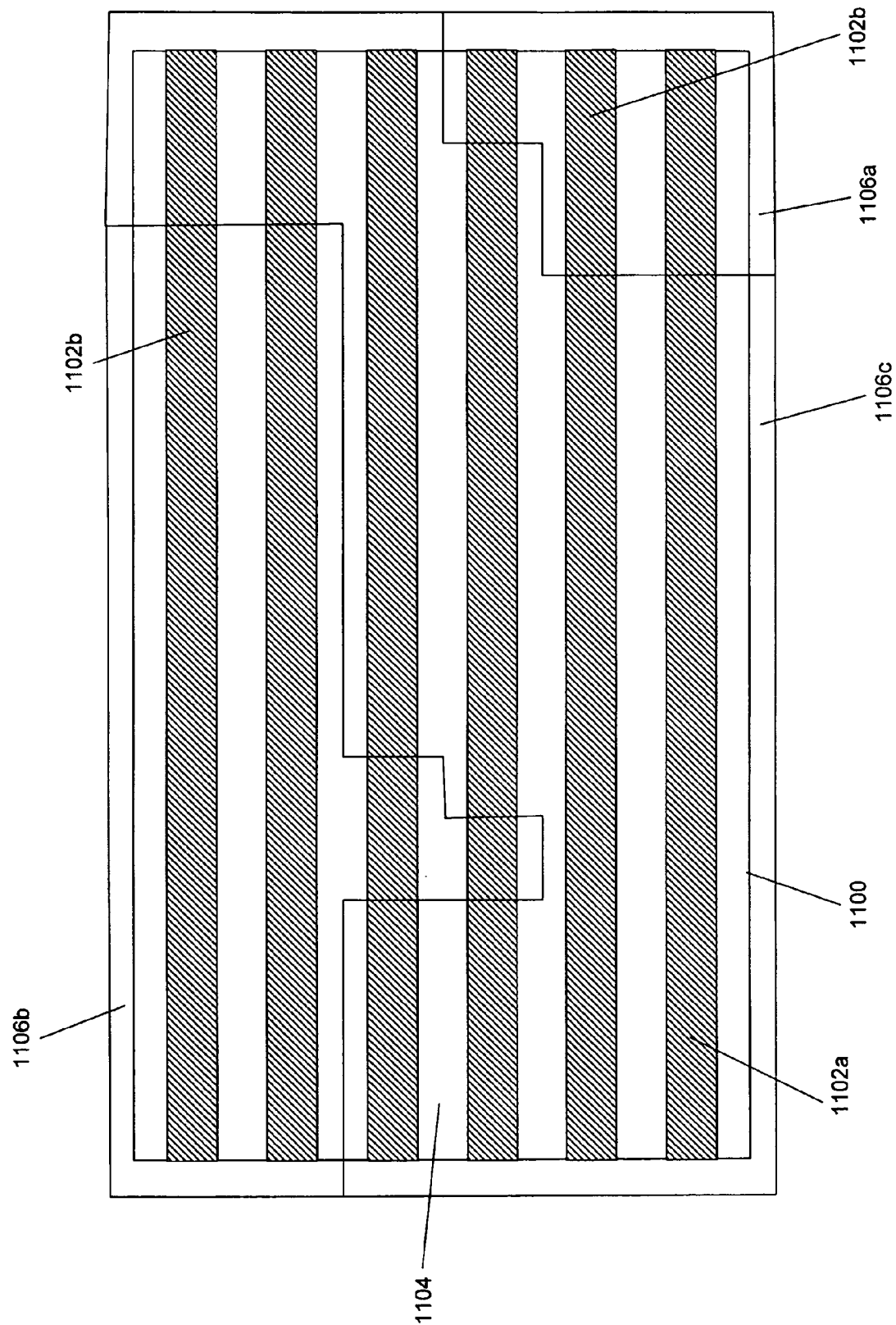
FIG. 26 is a schematic diagram showing the masking of the Y-direction interference pattern of FIG. 24 with a transparent mask to illustrate the underlying pattern.

Referring to FIG. 26, a transparent view of the mask 1106 is provided. This reveals portions 1102a that will be unexposed, and portions 1102b under 1106a and 1106b that will be exposed after a light source is applied to photoresist 1100.

Figure 27:
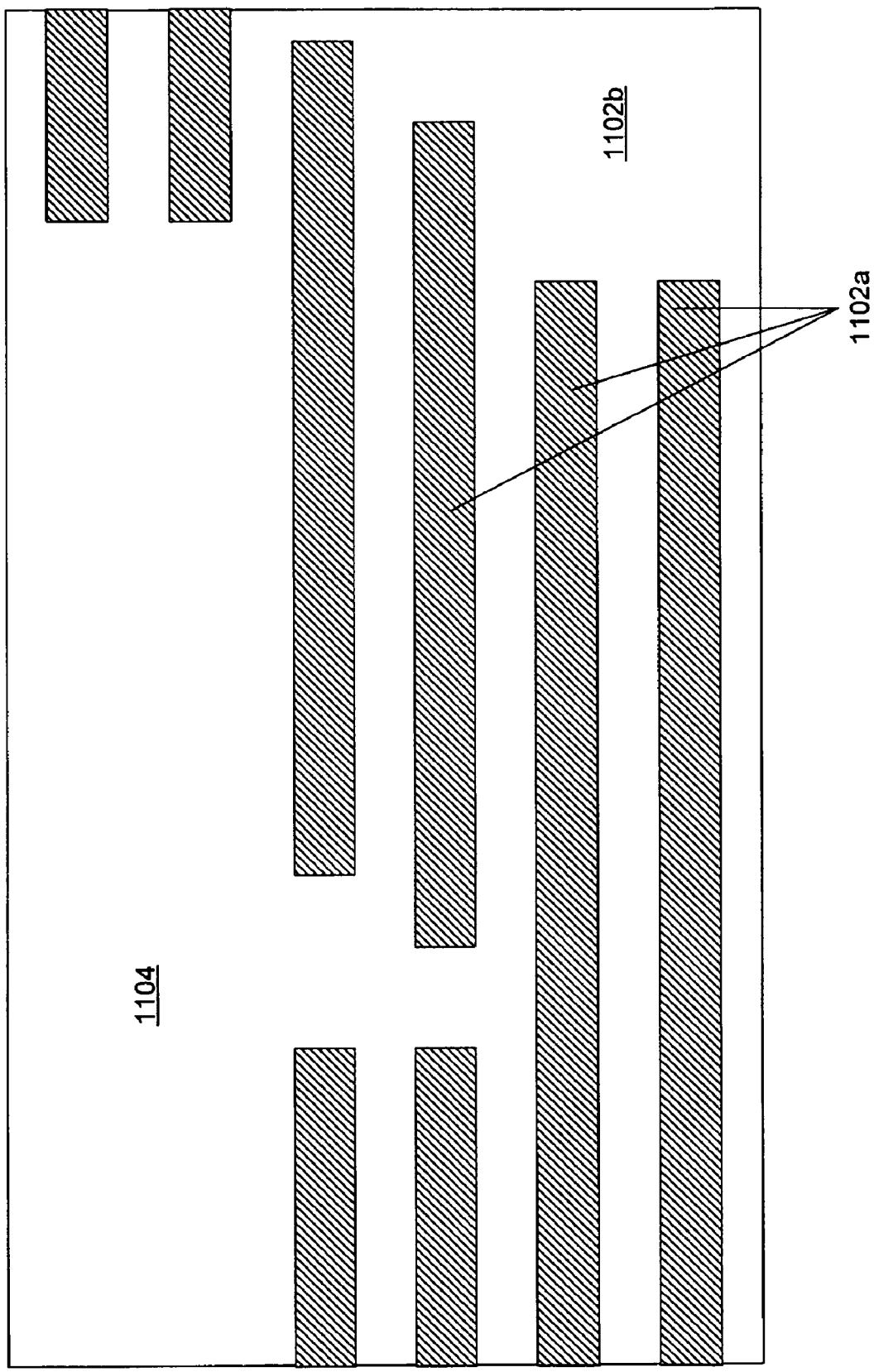
FIG. 27 is a schematic diagram showing the remaining Y-direction interference pattern of FIG. 24 after the masking of FIG. 25.

Referring to FIG. 27, the photoresist 1100 is shown after a light source has been applied, and photoresist 1100 has been developed. Only the unexposed regions 1102a which were covered by opaque mask portion 1106c remain as the patterned photoresist or resist image, while the remainder 1102b and 1104 of the exposed photoresist 1100 is covered by exposed negative resist in the developing process, in a conventional manner. Finally, the second etch process is applied to transfer resist pattern to substrate.

Figure 28:
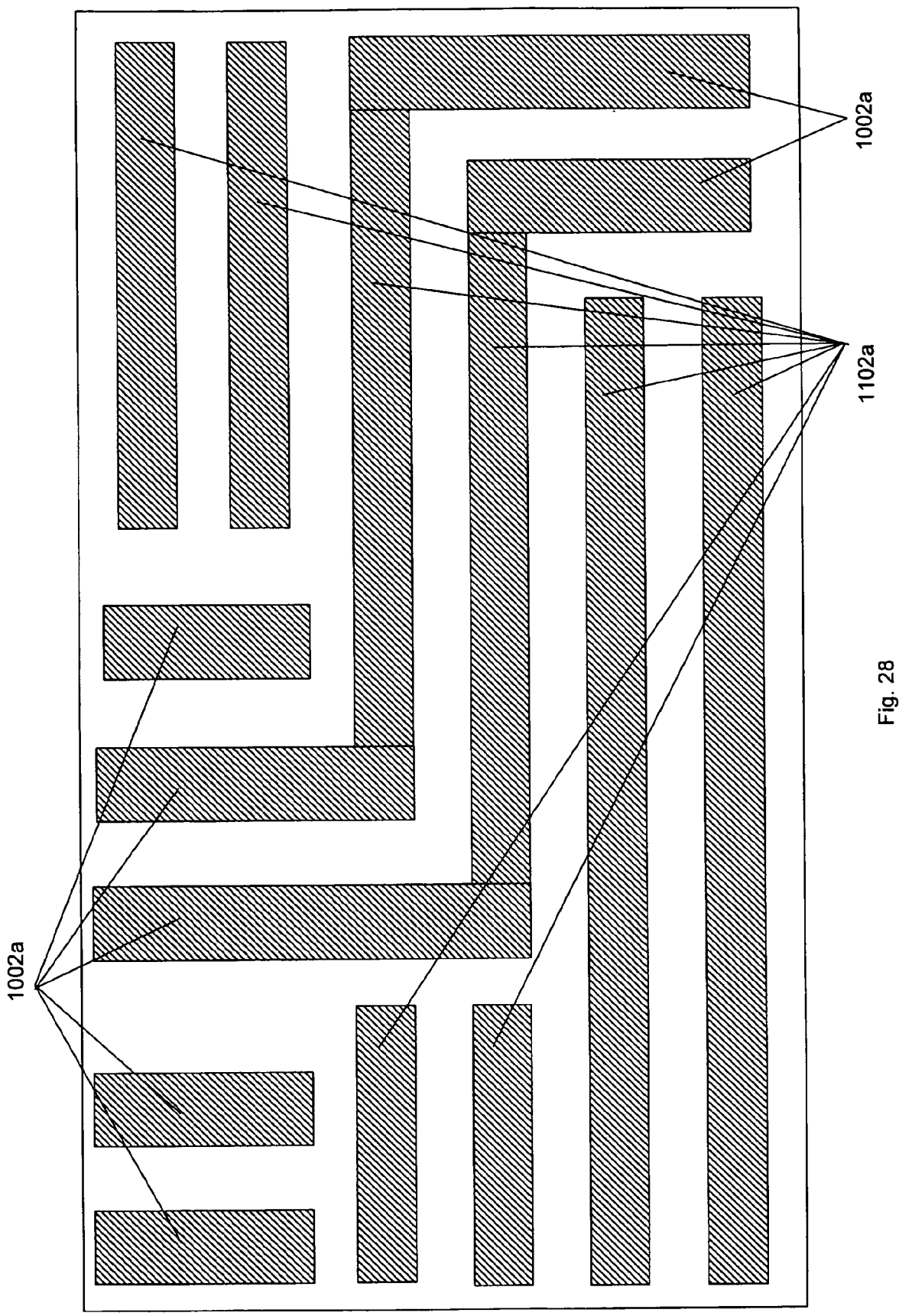
FIG. 28 is a schematic diagram showing the Y-direction interference pattern etched into the substrate of FIG. 27 combined with the X-direction interference pattern etched into the substrate of FIG. 22.

Referring to FIG. 28, the etched patterns on the substrate are shown as a combined pattern. As illustrated, only the regions 1002a and regions 1102a remain to form the final desired patterns.

The present disclosure has been described relative to various embodiments. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the disclosure will be employed without a corresponding use of other features. For example, various combinations of the above embodiments may be used, such as forming lines in one direction using a negative photoresist, while forming lines in another direction using a positive photoresist, or vice versa. Furthermore, although the lines used for purposes of example are generally located with respect to an x-axis and a y-axis, it is understood that various other directions (e.g., diagonal lines) may be formed using the methods described above. Accordingly, it is appropriate that the appended claims be construed broadly and in a manner consistent with the scope of the disclosure.

What is claimed is:

1. A method for producing a pattern on a substrate covered with a photosensitive material, the method comprising:
   exposing the substrate with a first standing wave interference pattern produced by a superposition of coherent beams of radiation;
   masking at least a first portion of the substrate;

exposing the substrate, subsequent to the masking, with at least a second standing wave interference pattern produced by a superposition of coherent beams of radiation;

masking at least a second portion of the substrate;

developing said photosensitive material; and wherein the superposition of coherent beams of electromagnetic radiation is formed by sending a single laser beam through a beam expander, reflecting said expanded beam from a first reflecting surface such that a lower portion of said reflected beam strikes the substrate while an upper portion of said beam strikes a second reflecting surface that is perpendicular to said substrate and which reflects said upper portion also onto the substrate, the lower and upper portions now making equal angles with the normal to the substrate and being symmetrically disposed about said normal.

2. The method of claim 1, wherein the beam expander comprises a pinhole placed between a first converging lens and a second converging lens, which second lens is coplanar with the first and of a larger diameter than the first lens, and wherein the lenses are positioned with the pinhole approximately at the common focal point each lens.

3. The method of claim 1, wherein the coherent beams of radiation are formed from a laser beam with wavelength between approximately 400 nm and 10 nm.

4. The method of claim 3, wherein the laser beam has a wavelength of approximately 248 nm.

5. The method of claim 3, wherein the laser beam has a wavelength of approximately 193 nm.

6. The method of claim 3, wherein the laser beam has a wavelength of approximately 157 nm.

7. The method of claim 3, wherein the laser beam has a wavelength smaller than 157 nm.

8. The method of claim 1, wherein the second standing wave exposure is made subsequent to rotating the substrate by an angle of 90° about the normal to its surface.

* * * * *